US008183680B2

(12) United States Patent
Zhao et al.

(10) Patent No.: US 8,183,680 B2
(45) Date of Patent: *May 22, 2012

(54) NO-LEAD IC PACKAGES HAVING INTEGRATED HEAT SPREADER FOR ELECTROMAGNETIC INTERFERENCE (EMI) SHIELDING AND THERMAL ENHANCEMENT

(75) Inventors: Sam Ziqun Zhao, Irvine, CA (US); Rezaur Rahman Khan, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 969 days.

This patent is subject to a terminal disclaimer.

(21) Appl. No.: 11/480,579

(22) Filed: Jul. 5, 2006

(65) Prior Publication Data
US 2007/0267734 A1   Nov. 22, 2007

Related U.S. Application Data

(60) Provisional application No. 60/800,433, filed on May 16, 2006.

(51) Int. Cl.
*H01L 23/24* (2006.01)
(52) U.S. Cl. ................... 257/687; 257/E23.037
(58) Field of Classification Search ............ 257/687, 257/E21.506; 438/119
See application file for complete search history.

(56) References Cited

U.S. PATENT DOCUMENTS

| | | |
|---|---|---|
| 3,790,866 A | 2/1974 | Meyer et al. |
| 4,480,262 A | 10/1984 | Butt |
| 4,560,826 A | 12/1985 | Burns et al. |
| 4,611,238 A | 9/1986 | Lewis et al. |
| 4,680,613 A | 7/1987 | Daniels et al. |
| 4,803,544 A | 2/1989 | Holzschuh et al. |
| 5,045,921 A | 9/1991 | Lin et al. |
| 5,065,281 A | 11/1991 | Hernandez et al. |
| 5,105,260 A | 4/1992 | Butera |
| 5,153,379 A | 10/1992 | Guzuk et al. |
| 5,173,766 A | 12/1992 | Long et al. |
| 5,208,504 A | 5/1993 | Parker et al. |
| 5,216,278 A | 6/1993 | Lin et al. |

(Continued)

FOREIGN PATENT DOCUMENTS
DE   42 13 251 A1   10/1992
(Continued)

OTHER PUBLICATIONS

The European Search Report as cited in Application No. 06026677.2-2203 dated Oct. 8, 2008, 3 pages.

(Continued)

*Primary Examiner* — Benjamin Sandvik
*Assistant Examiner* — Krista Soderholm
(74) *Attorney, Agent, or Firm* — Sterne, Kessler, Goldstein & Fox P.L.L.C.

(57) ABSTRACT

Methods and apparatus for improved thermal performance and electromagnetic interference (EMI) shielding in integrated circuit (IC) packages are described. A die-up or die-down package includes an IC die, a die attach pad, a heat spreader cap coupled to the die attach pad defining a cavity, and one or more peripheral rows of leads surrounding the die attach pad. The leads do not protrude substantially from the footprint of the encasing structure. The die attach pad and the heat spreader cap defines an encasing structure that substantially encloses the IC die, and shields EMI emanating from and radiating towards the IC die. The encasing structure also dissipates heat generated by the IC die during operation.

49 Claims, 26 Drawing Sheets

U.S. PATENT DOCUMENTS

| | | | |
|---|---|---|---|
| 5,223,739 A | 6/1993 | Katsumata et al. | |
| 5,285,352 A | 2/1994 | Pastore et al. | |
| 5,291,062 A | 3/1994 | Higgins, III | |
| 5,294,826 A | 3/1994 | Marcantonio et al. | |
| 5,350,943 A | 9/1994 | Angerstein et al. | |
| 5,366,589 A | 11/1994 | Chang | |
| 5,376,756 A | 12/1994 | Kwon | |
| 5,389,816 A | 2/1995 | Shimizu et al. | |
| 5,394,009 A | 2/1995 | Loo | |
| 5,397,917 A | 3/1995 | Ommen et al. | |
| 5,397,921 A | 3/1995 | Karnezos | |
| 5,409,865 A | 4/1995 | Karnezos | |
| 5,433,631 A | 7/1995 | Beaman et al. | |
| 5,438,216 A | 8/1995 | Juskey et al. | |
| 5,468,910 A | 11/1995 | Knapp et al. | |
| 5,474,957 A | 12/1995 | Urushima | |
| 5,482,898 A | 1/1996 | Marrs | |
| 5,486,720 A | 1/1996 | Kierse | |
| 5,490,324 A | 2/1996 | Newman | |
| 5,497,032 A | 3/1996 | Tsuji et al. | |
| 5,534,467 A | 7/1996 | Rostoker | |
| 5,541,450 A | 7/1996 | Jones et al. | |
| 5,546,458 A | 8/1996 | Iwami | |
| 5,552,635 A | 9/1996 | Kim et al. | |
| 5,559,306 A * | 9/1996 | Mahulikar | 174/538 |
| 5,572,405 A | 11/1996 | Wilson et al. | |
| 5,578,869 A | 11/1996 | Hoffman et al. | |
| 5,583,377 A | 12/1996 | Higgins, III | |
| 5,583,378 A | 12/1996 | Marrs et al. | |
| 5,642,261 A | 6/1997 | Bond et al. | |
| 5,648,679 A | 7/1997 | Chillara et al. | |
| 5,650,659 A | 7/1997 | Mostafazadeh et al. | |
| 5,650,662 A | 7/1997 | Edwards et al. | |
| 5,668,406 A | 9/1997 | Egawa | |
| 5,691,567 A | 11/1997 | Lo et al. | |
| 5,717,252 A | 2/1998 | Nakashima et al. | |
| 5,732,465 A | 3/1998 | Tokita et al. | |
| 5,736,785 A | 4/1998 | Chiang et al. | |
| 5,744,863 A | 4/1998 | Culnane et al. | |
| 5,796,170 A | 8/1998 | Marcantonio | |
| 5,798,909 A | 8/1998 | Bhatt et al. | |
| 5,801,432 A | 9/1998 | Rostoker et al. | |
| 5,822,848 A * | 10/1998 | Chiang | 438/106 |
| 5,835,355 A | 11/1998 | Dordi | |
| 5,843,808 A | 12/1998 | Karnezos | |
| 5,844,168 A | 12/1998 | Schueller et al. | |
| 5,856,911 A | 1/1999 | Riley | |
| 5,866,949 A | 2/1999 | Schueller | |
| 5,883,430 A | 3/1999 | Johnson | |
| 5,889,316 A | 3/1999 | Strobel et al. | |
| 5,889,321 A | 3/1999 | Culnane et al. | |
| 5,889,324 A | 3/1999 | Suzuki | |
| 5,894,410 A | 4/1999 | Barrow | |
| 5,895,967 A | 4/1999 | Stearns et al. | |
| 5,901,041 A | 5/1999 | Davies et al. | |
| 5,903,052 A | 5/1999 | Chen et al. | |
| 5,905,633 A | 5/1999 | Shim et al. | |
| 5,907,189 A | 5/1999 | Mertol | |
| 5,907,903 A | 6/1999 | Ameen et al. | |
| 5,920,117 A | 7/1999 | Sono et al. | |
| 5,949,137 A | 9/1999 | Domadia et al. | |
| 5,953,589 A | 9/1999 | Shim et al. | |
| 5,972,734 A | 10/1999 | Carichner et al. | |
| 5,976,912 A | 11/1999 | Fukutomi et al. | |
| 5,977,626 A | 11/1999 | Wang et al. | |
| 5,977,633 A | 11/1999 | Suzuki et al. | |
| 5,982,621 A | 11/1999 | Li | |
| 5,986,340 A | 11/1999 | Mostafazadeh et al. | |
| 5,986,885 A | 11/1999 | Wyland | |
| 5,998,241 A | 12/1999 | Niwa | |
| 5,999,415 A | 12/1999 | Hamzehdoost | |
| 6,002,147 A | 12/1999 | Iovdalsky et al. | |
| 6,002,169 A | 12/1999 | Chia et al. | |
| 6,011,303 A | 1/2000 | Tanaka et al. | |
| 6,011,304 A | 1/2000 | Mertol | |
| 6,011,694 A | 1/2000 | Hirakawa | |
| 6,020,637 A | 2/2000 | Karnezos | |
| 6,028,358 A | 2/2000 | Suzuki | |
| 6,034,427 A | 3/2000 | Lan et al. | |
| 6,040,984 A | 3/2000 | Hirakawa | |
| 6,057,601 A | 5/2000 | Lau et al. | |
| 6,060,777 A | 5/2000 | Jamieson et al. | |
| 6,064,111 A | 5/2000 | Sota et al. | |
| 6,069,407 A | 5/2000 | Hamzehdoost | |
| 6,077,724 A | 6/2000 | Chen | |
| 6,084,297 A | 7/2000 | Brooks et al. | |
| 6,084,777 A | 7/2000 | Kalidas et al. | |
| 6,092,281 A | 7/2000 | Glenn et al. | |
| 6,114,761 A | 9/2000 | Mertol et al. | |
| 6,117,797 A | 9/2000 | Hembree | |
| 6,122,171 A | 9/2000 | Akram et al. | |
| 6,133,064 A | 10/2000 | Nagarajan et al. | |
| 6,140,707 A | 10/2000 | Plepys et al. | |
| 6,160,705 A | 12/2000 | Stearns et al. | |
| 6,162,659 A | 12/2000 | Wu | |
| 6,163,458 A | 12/2000 | Li | |
| 6,166,434 A | 12/2000 | Desai et al. | |
| 6,184,580 B1 | 2/2001 | Lin | |
| 6,201,300 B1 | 3/2001 | Tseng et al. | |
| 6,207,467 B1 | 3/2001 | Vaiyapuri et al. | |
| 6,212,070 B1 | 4/2001 | Atwood et al. | |
| 6,229,702 B1 | 5/2001 | Tao et al. | |
| 6,229,802 B1 | 5/2001 | Hippelainen | |
| 6,242,279 B1 | 6/2001 | Ho et al. | |
| 6,246,111 B1 | 6/2001 | Huang et al. | |
| 6,278,613 B1 | 8/2001 | Fernandez et al. | |
| 6,288,444 B1 | 9/2001 | Abe et al. | |
| 6,313,521 B1 | 11/2001 | Baba | |
| 6,313,525 B1 | 11/2001 | Sasano | |
| 6,347,037 B2 | 2/2002 | Iijima et al. | |
| 6,362,525 B1 | 3/2002 | Rahim | |
| 6,365,980 B1 | 4/2002 | Carter, Jr. et al. | |
| 6,369,455 B1 | 4/2002 | Ho et al. | |
| 6,380,623 B1 | 4/2002 | Demore | |
| 6,432,742 B1 | 8/2002 | Guan et al. | |
| 6,462,274 B1 | 10/2002 | Shim et al. | |
| 6,472,741 B1 | 10/2002 | Chen et al. | |
| 6,525,942 B2 | 2/2003 | Huang et al. | |
| 6,528,869 B1 | 3/2003 | Glenn et al. | |
| 6,528,876 B2 | 3/2003 | Huang | |
| 6,528,892 B2 | 3/2003 | Caletka et al. | |
| 6,541,832 B2 | 4/2003 | Coyle | |
| 6,545,351 B1 | 4/2003 | Jamieson et al. | |
| 6,552,266 B2 | 4/2003 | Carden et al. | |
| 6,552,428 B1 | 4/2003 | Huang et al. | |
| 6,552,430 B1 | 4/2003 | Perez et al. | |
| 6,563,712 B2 | 5/2003 | Akram et al. | |
| 6,583,516 B2 | 6/2003 | Hashimoto | |
| 6,602,732 B2 | 8/2003 | Chen | |
| 6,614,102 B1 * | 9/2003 | Hoffman et al. | 257/666 |
| 6,614,660 B1 | 9/2003 | Bai et al. | |
| 6,617,193 B1 | 9/2003 | Toshio et al. | |
| 6,617,197 B1 | 9/2003 | Bayan et al. | |
| 6,617,200 B2 | 9/2003 | Sone | |
| 6,657,870 B1 | 12/2003 | Ali et al. | |
| 6,664,617 B2 | 12/2003 | Siu | |
| 6,724,071 B2 | 4/2004 | Combs | |
| 6,724,080 B1 | 4/2004 | Ooi et al. | |
| 6,737,750 B1 | 5/2004 | Hoffman et al. | |
| 6,775,140 B2 | 8/2004 | Shim et al. | |
| 6,825,108 B2 | 11/2004 | Khan et al. | |
| 6,838,761 B2 | 1/2005 | Karnezos | |
| 6,852,574 B1 * | 2/2005 | Quah et al. | 438/123 |
| 6,853,070 B2 | 2/2005 | Khan et al. | |
| 6,861,750 B2 | 3/2005 | Zhao et al. | |
| 6,876,553 B2 | 4/2005 | Zhao et al. | |
| 6,879,039 B2 | 4/2005 | Khan et al. | |
| 6,882,042 B2 | 4/2005 | Zhao et al. | |
| 6,887,741 B2 | 5/2005 | Zhao et al. | |
| 6,906,414 B2 | 6/2005 | Zhao et al. | |
| 6,919,630 B2 | 7/2005 | Hsiao | |
| 6,989,593 B2 | 1/2006 | Khan et al. | |
| 7,005,737 B2 | 2/2006 | Zhao et al. | |
| 7,015,072 B2 | 3/2006 | Combs et al. | |
| 7,015,379 B2 | 3/2006 | Hood et al. | |
| 7,026,711 B2 | 4/2006 | Lee et al. | |
| 7,038,312 B2 | 5/2006 | Khan et al. | |

| | | |
|---|---|---|
| 7,057,277 B2 | 6/2006 | Chen et al. |
| 7,061,102 B2 | 6/2006 | Eghan et al. |
| 7,078,806 B2 | 7/2006 | Khan et al. |
| 7,102,225 B2 | 9/2006 | Khan et al. |
| 7,132,744 B2 | 11/2006 | Zhao et al. |
| 7,148,084 B2 | 12/2006 | Strobel et al. |
| 7,161,239 B2 | 1/2007 | Zhao et al. |
| 7,196,415 B2 | 3/2007 | Zhong et al. |
| 7,198,987 B1 | 4/2007 | Warren et al. |
| 7,202,559 B2 | 4/2007 | Zhao et al. |
| 7,227,256 B2 | 6/2007 | Zhao et al. |
| 7,241,645 B2 | 7/2007 | Zhao et al. |
| 7,245,500 B2 | 7/2007 | Khan et al. |
| 7,259,445 B2 | 8/2007 | Lau et al. |
| 7,259,448 B2 | 8/2007 | Zhang et al. |
| 7,259,457 B2 | 8/2007 | Zhang et al. |
| 7,271,479 B2 | 9/2007 | Zhao et al. |
| 7,312,108 B2 | 12/2007 | Zhao et al. |
| 2001/0001505 A1 | 5/2001 | Schueller et al. |
| 2001/0040279 A1 | 11/2001 | Mess et al. |
| 2001/0045644 A1 | 11/2001 | Huang |
| 2002/0037604 A1* | 3/2002 | Lee et al. .................. 438/112 |
| 2002/0053731 A1 | 5/2002 | Chao et al. |
| 2002/0072214 A1 | 6/2002 | Yuzawa et al. |
| 2002/0079562 A1 | 6/2002 | Zhao et al. |
| 2002/0079572 A1 | 6/2002 | Khan et al. |
| 2002/0096767 A1 | 7/2002 | Cote et al. |
| 2002/0098617 A1 | 7/2002 | Lee et al. |
| 2002/0109226 A1 | 8/2002 | Khan et al. |
| 2002/0135065 A1 | 9/2002 | Zhao et al. |
| 2002/0171144 A1 | 11/2002 | Zhang et al. |
| 2002/0180040 A1 | 12/2002 | Camenforte et al. |
| 2002/0185717 A1 | 12/2002 | Eghan et al. |
| 2002/0185720 A1 | 12/2002 | Khan et al. |
| 2002/0185722 A1 | 12/2002 | Zhao et al. |
| 2002/0185734 A1 | 12/2002 | Zhao et al. |
| 2002/0185750 A1 | 12/2002 | Khan et al. |
| 2002/0190361 A1 | 12/2002 | Zhao et al. |
| 2002/0190362 A1 | 12/2002 | Khan et al. |
| 2003/0057550 A1 | 3/2003 | Zhao et al. |
| 2003/0111726 A1 | 6/2003 | Khan et al. |
| 2003/0111728 A1 | 6/2003 | Thai et al. |
| 2003/0138613 A1 | 7/2003 | Thoman et al. |
| 2003/0146503 A1 | 8/2003 | Khan et al. |
| 2003/0146506 A1 | 8/2003 | Khan et al. |
| 2003/0146509 A1 | 8/2003 | Zhao et al. |
| 2003/0146511 A1 | 8/2003 | Zhao et al. |
| 2003/0178719 A1 | 9/2003 | Combs et al. |
| 2003/0179549 A1 | 9/2003 | Zhong et al. |
| 2003/0179556 A1 | 9/2003 | Zhao et al. |
| 2004/0072456 A1 | 4/2004 | Dozier, II et al. |
| 2004/0113284 A1 | 6/2004 | Zhao et al. |
| 2004/0231872 A1* | 11/2004 | Arnold et al. ............... 174/35 R |
| 2004/0238857 A1 | 12/2004 | Beroz et al. |
| 2004/0251476 A1 | 12/2004 | Strobel et al. |
| 2005/0012203 A1 | 1/2005 | Rahman et al. |
| 2005/0029657 A1 | 2/2005 | Khan et al. |
| 2005/0035452 A1 | 2/2005 | Zhang et al. |
| 2005/0046001 A1 | 3/2005 | Warner |
| 2005/0077545 A1 | 4/2005 | Zhao et al. |
| 2005/0127501 A1 | 6/2005 | Khan et al. |
| 2005/0280127 A1 | 12/2005 | Zhao et al. |
| 2005/0280139 A1 | 12/2005 | Zhao et al. |
| 2005/0280141 A1 | 12/2005 | Zhang |
| 2006/0065972 A1 | 3/2006 | Khan et al. |
| 2006/0091542 A1 | 5/2006 | Zhao et al. |
| 2006/0156080 A1* | 7/2006 | Tellkamp et al. ............. 714/700 |
| 2006/0166397 A1 | 7/2006 | Lau et al. |
| 2006/0197207 A1* | 9/2006 | Chow et al. .................. 257/686 |
| 2007/0007644 A1 | 1/2007 | Zhao et al. |
| 2007/0040267 A1 | 2/2007 | Zhao et al. |
| 2007/0045824 A1 | 3/2007 | Zhao et al. |
| 2007/0090502 A1 | 4/2007 | Zhao et al. |
| 2007/0108598 A1 | 5/2007 | Zhong et al. |
| 2007/0200210 A1 | 8/2007 | Zhao et al. |
| 2007/0267740 A1 | 11/2007 | Khan et al. |
| 2007/0273023 A1 | 11/2007 | Zhao et al. |
| 2007/0273049 A1 | 11/2007 | Khan et al. |
| 2007/0278632 A1 | 12/2007 | Zhao et al. |
| 2007/0290322 A1 | 12/2007 | Zhao et al. |
| 2007/0290376 A1 | 12/2007 | Zhao et al. |
| 2008/0006934 A1 | 1/2008 | Zhao et al. |
| 2008/0283978 A1* | 11/2008 | Aripin et al. .................. 257/670 |

FOREIGN PATENT DOCUMENTS

| | | |
|---|---|---|
| EP | 0 573 297 A2 | 12/1993 |
| EP | 0 684 645 A2 | 11/1995 |
| EP | 0 504 411 B1 | 6/1998 |
| EP | 1 336 993 A1 | 8/2003 |
| EP | 1 341 228 A2 | 9/2003 |
| FR | 2 803 098 A3 | 6/2001 |
| JP | 61-49446 A | 3/1986 |
| JP | 7-283336 A | 10/1995 |
| JP | 10-50877 A | 2/1998 |
| JP | 10-189835 A | 7/1998 |
| JP | 10-247702 A | 9/1998 |
| JP | 10-247703 A | 9/1998 |
| JP | 11-17064 A | 1/1999 |
| JP | 11-102989 A | 4/1999 |
| JP | 2000-286294 A | 10/2000 |
| JP | 2001-68512 A | 3/2001 |
| TW | 383908 | 3/2000 |
| TW | 417219 | 1/2001 |
| WO | WO 2005/059995 | 6/2005 |

OTHER PUBLICATIONS

English-language Summary of Decision of Rejection from Taiwanese Application No. 91108753, 5 pages, Oct. 24, 2003.

Ahn, S.H. and Kwon, Y.S., "Popcorn Phenomena in a Ball Grid Array Package", *IEEE Transactions on Components, Packaging, and Manufacturing Technology Part B: Advanced Packaging*, IEEE, Aug. 1995, vol. 18, No. 3, pp. 491-495.

Amkor Electronics, "Amkor BGA Packaging: Taking The World By Storm", *Electronic Packaging & Production*, Cahners Publishing Company, May 1994, page unknown.

Anderson, L. and Trabucco, B., "Solder Attachment Analysis of Plastic BGA Modules", *Surface Mount International Conference*, Surface Mount International, Aug. 28-Sep. 1, 1994, San Jose, California, pp. 189-194.

Andrews, M., "Trends in Ball Grid Array Technology," *Ball Grid Array National Symposium*, Mar. 29-30, 1995, Dallas, Texas, 10 pages.

Attarwala, A.I. Dr. and Stierman, R., "Failure Mode Analysis of a 540 Pin Plastic Ball Grid Array", *Surface Mount International Conference*, Surface Mount International, Aug. 28-Sep. 1, 1994, San Jose, California, pp. 252-257.

Banerji, K., "Development of the Slightly Larger Than IC Carrier (SLICC)", *Journal of Surface Mount Technology*, Jul. 1994, pp. 21-26.

Bauer, C., Ph.D., "Partitioning and Die Selection Strategies for Cost Effective MCM Designs", *Journal of Surface Mount Technology*, Oct. 1994, pp. 4-9.

Bernier, W.E. et al., "*BGA* vs. *QFP*: A Summary of Tradeoffs for Selection of High I/O Components", *Surface Mount International Conference Proceedings*, Surface Mount International, Aug. 28-Sep. 1, 1994, San Jose, California, pp. 181-185.

Burgos, J. et al., "Achieving Accurate Thermal Characterization Using a CFD Code—A Case Study of Plastic Packages", *IEEE Transactions on Components, Packaging, and Manufacturing Technology Part A*, IEEE, Dec. 1995, vol. 18, No. 4, pp. 732-738.

Chadima, M., "Interconnecting Structure Manufacturing Technology," *Ball Grid Array National Symposium*, Dallas, Texas, Mar. 29-30, 1995, 12 pages.

Chanchani, R. et al., "Mini BGA: Pad and Pitch Ease Die Test and Handling", *Advanced Packaging*, IHS Publishing Group, May/Jun. 1995, pp. 34 and 36-37.

Chung, T.C. et al., "Rework of Plastic, Ceramic, and Tape Ball Grid Array Assemblies", *Ball Grid Array National Symposium Proceedings*, Dallas, Texas, Mar. 29-30, 1995, pp. 1-15.

Cole, M.S. and Caulfield, T. "A Review of Available Ball Grid Array (BGA) Packages", *Journal of Surface Mount Technology*, Surface Mount Technology Association, Jan. 1996, vol. 9, pp. 4-11.

Cole, M.S. and Caulfield, T., "Ball Grid Array Packaging", *Surface Mount International Conference Proceedings*, Surface Mount International, Aug. 28-Sep. 1, 1994, San Jose, California, pp. 147-153.

Dobers, M. and Seyffert, M., "Low Cost MCMs: BGAs Provide a Fine-Pitch Alternative", *Advanced Packaging*, IHS Publishing Group, Sep./Oct. 1994, vol. 3, No. 5, pp. 28, 30 and 32.

Dody, G. and Burnette, T., "BGA Assembly Process and Rework", *Journal of Surface Mount Technology*, Surface Mount Technology Association, Jan. 1996, vol. 9, pp. 39-45.

Edwards, D. et al., "The Effect of Internal Package Delaminations on the Thermal Performance of PQFP, Thermally Enhanced PQFP, LOC and BGA Packages", *45th Electronic Components & Technology Conference*, IEEE, May 21-24, 1995, Las Vegas, NV, pp. 285-292.

Ejim, T.L. et al., "Designed Experiment to Determine Attachment Reliability Drivers for PBGA Packages", *Journal of Surface Mount Technology*, Surface Mount Technology Association, Jan. 1996, vol. 9, pp. 30-38.

English-language Abstract of JP 10-189835, published Jul. 21, 1998, 1 page, printed from http://v3.espacenet.com.

English-language Translation of JP 10-247702, published Sep. 14, 1998, 8 pages.

English-language Abstract of JP 10-247703, published Sep. 14, 1998, 1 page, printed from http://v3.espacenet.com.

English-language Abstract of JP 10-050877, published Feb. 20, 1998, 1 page, printed from http://v3.espacenet.com.

English-language Translation of JP 11-102989, published Apr. 14, 1999, 24 pages.

English-language Abstract of JP 11-017064, published Jan. 22, 1999, 1 page, printed from http://v3.espacenet.com.

English-language Abstract of JP 2000-286294, published Oct. 13, 2000, 1 page, printed from http://v3.espacenet.com.

English-language Abstract of JP 2001-068512, published Mar. 16, 2001, 1 page, printed from http://v3.espacenet.com.

English-language Abstract of JP 61-049446, published Mar. 11, 1986, 1 page, printed from http://v3.espacenet.com.

English-language Abstract of JP 7-283336, published Oct. 27, 1995, 1 page, printed from http://v3.espacenet.com.

Ewanich, J. et al., "Development of a Tab (TCP) Ball Grid Array Package", *Proceedings of the 1995 International Electronics Packaging Conference*, San Diego, CA, Sep. 24-27, 1995, pp. 588-594.

Fauser, S. et al, "High Pin-Count PBGA Assembly", *Circuits Assembly*, Feb. 1995, vol. 6, No. 2, pp. 36-38 and 40.

Fauser, Suzanne et al., "High Pin Count PBGA Assembly: Solder Defect Failure Modes and Root Cause Analysis", *Surface Mount International, Proceedings of The Technical Program*, Surface Mount International, Aug. 28-Sep. 1, 1994, San Jose, California, pp. 169-174.

Ferguson, M. "Ensuring High-Yield BGA Assembly", *Circuits Assembly*, Feb. 1995, vol. 6, No. 2, pp. 54, 56 and 58.

Freda, M., "Laminate Technology for IC Packaging", *Electronic Packaging & Production*, Cahners Publishing Company, Oct. 1995, vol. 35, No. 11, pp. S4-S5.

Freedman, M., "Package Size and Pin-Out Standardization", *Ball Grid Array National Symposium*, Mar. 29-30, 1995, 6 pages.

Freyman, B. and Pennisi, R., "Overmolded Plastic Pad Array Carriers (OMPAC): A Low Cost, High Interconnect Density IC Packaging Solution for Consumer and Industrial Electronics", *41st Electronic Components & Technology Conference*, IEEE, May 11-16, 1991, pp. 176-182.

Freyman, B. et al., "Surface Mount Process Technology for Ball Grid Array Packaging", *Surface Mount International Conference Proceedings*, Surface Mount International, Aug. 29-Sep. 2, 1993, San Jose, California, pp. 81-85.

Freyman, B. et al., "The Move to Perimeter Plastic BGAs", *Surface Mount International Conference Proceedings*, San Jose, CA, Aug. 29-31, 1995, pp. 373-382.

Freyman, B., "Trends in Plastic BGA Packaging," *Ball Grid Array National Symposium*, Dallas, Texas, Mar. 29-30, 1995, 44 pages.

Gilleo, K., "Electronic Polymers: Die Attach and Oriented Z-Axis Films", *Advanced Packaging*, IHS Publishing Group, Sep./Oct. 1994, vol. 3, No. 5, pp. 37-38, 40 and 42.

Guenin, B. et al., "Analysis of a Thermally Enhanced Ball Grid Array Package", *IEEE Transactions on Components, Packaging, and Manufacturing Technology, Part A*, IEEE Components, Packaging, and Manufacturing Technology Society, Dec. 1995, vol. 18, No. 4, pp. 749-757.

Hart, C. "Vias in Pads", *Circuits Assembly*, Feb. 1995, vol. 6, No. 2, pp. 42, 44-46 and 50.

Hart, C., "Vias in Pads for Coarse and Fine Pitch Ball Grid Arrays", *Surface Mount International Conference Proceedings*, Surface Mount International, Aug. 28-Sep. 1, 1994, San Jose, California, pp. 203-207.

Hattas, D., "BGAs Face Production Testing: New Package Offers Promise but Must Clear Technology Hurdles.", *Advanced Packaging*, IHS Publishing Group, Summer 1993, vol. 2, No. 3, pp. 44-46.

Hayden, T.F. et al., "Thermal & Electrical Performance and Reliability Results for Cavity-Up Enhanced BGAs", *Electronic Components and Technology Conference*, IEEE, 1999, pp. 638-644.

Heitmann, R., "A Direct Attach Evolution: TAB, COB and Flip Chip Assembly Challenges", *Advanced Packaging*, IHS Publishing Group, Jul./Aug. 1994, vol. 3, No. 4, pp. 95-99.

Hodson, T., "Study Examines BGA Use", *Electronic Packaging & Production*, Mar. 1993, page unknown.

Holden, H., "The Many Techniques of Small Via Formation for Thin Boards", *The Institute for Interconnecting and Packaging Electronic Circuits Ball Grid Array National Symposium*, San Diego, CA, Jan. 18-19, 1996, pp. 1-7.

Houghten, J., "New Package Takes on QFPs", *Advanced Packaging*, IHS Publishing Group, Winter 1993, vol. 2, No. 1, pp. 38-39.

Houghten, J.L., "Plastic Ball-Grid Arrays Continue to Evolve", *Electronic Design*, Feb. 6, 1995, pp. 141-146.

"How to Give Your BGAs a Better Bottom Line.", *Advanced Packaging*, IHS Publishing Group, May/Jun. 1995, page unknown.

Huang, W. and Ricks, J., "Electrical Characterization of PBGA for Communication Applications by Simulation and Measurement", *National Electronic Packaging and Production Conference West '95*, Feb. 26-Mar. 2, 1995, Anaheim, California, pp. 300-307.

Hundt, M. et al., "Thermal Enhancements of Ball Grid Arrays", *National Electronic Packaging and Production Conference West '95*, Reed Exhibition Companies, Anaheim, CA, Feb. 25-29, 1996, pp. 702-711.

Hutchins, C.L., "Understanding Grid Array Packages", *Surface Mount Technology Magazine*, IHS Publishing Group, Nov. 1994, vol. 8, No. 11, pp. 12-13.

Hwang, J.S., "A Hybrid of QFP and BGA Architectures", *Surface Mount Technology Magazine*, IHS Publishing Group, Feb. 1995, vol. 9, No. 2, p. 18.

Hwang, J.S., "Reliability of BGA Solder Interconnections", *Surface Mount Technology Magazine*, IHS Publishing Group, Sep. 1994, vol. 8, No. 9, pp. 14-15.

Johnson, R. et al., "A Feasibility Study of of Ball Grid Array Packaging", *National Electronic Packaging and Production Conference East '93*, Boston, Massachusetts, Jun. 14-17, 1993, pp. 413-422.

Johnson, R. et al., "Thermal Characterization of 140 and 225 Pin Ball Grid Array Packages", *National Electronic Packaging & Production Conference East '93*, Boston, Massachusetts, Jun. 14-17, 1993, pp. 423-430.

Johnston, P. "Printed Circuit Board Design Guidelines for Ball Grid Array Packages", *Journal of Surface Mount Technology*, Surface Mount Technology Association, Jan. 1996, vol. 9, pp. 12-18.

Johnston, P., "Land Pattern Interconnectivity Schemes", *Ball Grid Array National Symposium*, Dallas, Texas, Mar. 29-30, 1995, pp. 2-21.

Karnezos, M., "An EPBGA Alternative," *Advanced Packaging*, Jun. 1998, pp. 90, 92, 94, and 96.

Kawahara, T. et al., "Ball Grid Array Type Package by Using of New Encapsulation Method", *Proceedings of the 1995 International Electronics Packaging Conference*, San Diego, CA, Sep. 24-27, 1995, pp. 577-587.

Knickerbocker, J.U. and Cole, M.S., "Ceramic BGA: A Packaging Alternative", *Advanced Packaging*, IHS Publishing Group, Jan./Feb. 1995, vol. 4, No. 1, pp. 20, 22 and 25.

Kromann, G., et al., "A Hi-Density C4/CBGA Interconnect Technology for a CMOS Microprocessor", *National Electronic Packaging and Production Conference West '95*, IEEE, Feb. 26-Mar. 2, 1995, Anaheim, California, pp. 1523-1529.

Kunkle, R., "Discrete Wiring for Array Packages", *Ball Grid Array National Symposium*, Dallas, Texas, Mar. 29-30, 1995, 9 pages.

Lall, B. et al, "Methodology for Thermal Evaluation of Multichip Modules", *IEEE Transactions on Components, Packaging, and Manufacturing Technology Part A*, IEEE, Dec. 1995, vol. 18, No. 4, pp. 758-764.

Lasance, C. et al., "Thermal Characterization of Electronic Devices with Boundary Condition Independent Compact Models", *IEEE Transactions on Components, Packaging, and Manufacturing Technology Part A*, IEEE Components, Packaging, and Manufacturing Technology Society, Dec. 1995, vol. 18, No. 4, pp. 723-731.

Lau, J. et al., "No Clean Mass Reflow of Large Plastic Ball Grid Array Packages", *Circuit World*, Wela Publications Ltd., vol. 20, No. 3, Mar. 1994, pp. 15-22.

Lau, J., *Ball Grid Array Technology*, McGraw-Hill Inc., 1995, entire book submitted.

"Literature Review", Special Supplement to *Electronic Packaging & Production*, Feb. 1995, Cahners Publication, 10 pages.

*LSI LOGIC Package Selector Guide, Second Edition*, LSI Logic Corporation, 1994-1995, entire document submitted.

"LTCC MCMs Lead to Ceramic BGAs," *Advanced Packaging*, IHS Publishing Group, Sep./Oct. 1994, vol. 3, No. 5, pp. 14-15.

Mak, Dr. W.C. et al., "Increased SOIC Power Dissipation Capability Through Board Design and Finite Element Modeling", *Journal of Surface Mount Technology*, Surface Mount International, Oct. 1994, pp. 33-41.

Marrs, R. et al., "Recent Technology Breakthroughs Achieved with the New *Super*BGA® Package", *1995 International Electronics Packaging Conference*, San Diego, California, Sep. 24-27, 1995, pp. 565-576.

Marrs, R.C. and Olachea, G., "BGAs for MCMs: Changing Markets and Product Functionality", *Advanced Packaging*, IHS Publishing Group, Sep./Oct. 1994, vol. 3, No. 5, pp. 48, 50, and 52.

Matthew, L.C. et al., "Area Array Packaging: KGD in a Chip-Sized Package", *Advanced Packaging*, IHS Publishing Group, Jul./Aug. 1994, pp. 91-94.

Mawer, A. et al., "Plastic BGA Solder Joint Reliability Considerations", *Surface Mount International Conference Proceedings*, Surface Mount International, Aug. 28-Sep. 1, 1994, San Jose, California, pp. 239-251.

Mazzullo, T. And Schaertl, L., "How IC Packages Affect PCB Design", *Surface Mount Technology Magazine*, Feb. 1995, vol. 9, No. 2, pp. 114-116.

Mearig, J., "An Overview of Manufacturing BGA Technology", *National Electronic Packaging and Production Conference West '95*, Feb. 26-Mar. 2, 1995, Anaheim, California, pp. 295-299.

Mertol, A., "Application of the Taguchi Method on the Robust Design of Molded 225 Plastic Ball Grid Array Packages", *IEEE Transactions on Components, Packaging, and Manufacturing Technology Part B: Advanced Packaging*, IEEE, Nov. 1995, vol. 18, No. 4, pp. 734-743.

Mescher, P. and Phelan, G., "A Practical Comparison of Surface Mount Assembly for Ball Grid Array Components", *Surface Mount International Conference Proceedings*, Surface Mount International, Aug. 28-Sep. 1, 1994, San Jose, California, pp. 164-168.

Mulgaonker, S. et al., "An Assessment of the Thermal Performance of the PBGA Family", *Eleventh Annual IEEE Semiconductor Thermal Measurement and Management Symposium*, IEEE, San Jose, CA, Feb. 7-9, 1995, pp. 17-27.

"New PBGA Pushes Technology to Outer Limits", *Advanced Packaging*, HIS Publishing Group, Jan./Feb. 1995, p. 11.

Olachea, G., "Managing Heat: A Focus on Power IC Packaging", *Electronic Packaging & Production (Special Supplement)*, Cahners Publishing Company, Nov. 1994, pp. 26-28.

"Pad Array Improves Density", *Electronic Packaging & Production*, Cahners Publishing Company, May 1992, pp. 25-26.

Partridge, J. and Viswanadham, P., "Organic Carrier Requirements for Flip Chip Assemblies", *Journal of Surface Mount Technology*, Surface Mount Technology Association, Jul. 1994, pp. 15-20.

Ramirez, C. and Fauser, S., "Fatigue Life Comparison of the Perimeter and Full Plastic Ball Grid Array", *Surface Mount International Conference Proceedings*, Surface Mount International, Aug. 28-Sep. 1, 1994, San Jose, California, pp. 258-266.

Rogren, P., "MCM-L Built on Ball Grid Array Formats", *National Electronic Packaging and Production Conference West '94*, Feb. 27-Mar. 4, 1994, Anaheim, California, pp. 1277-1282.

Rooks, S., "X-Ray Inspection of Flip Chip Attach Using Digital Tomosynthesis", *Surface Mount International Proceedings of the Technical Program*, Aug. 28-Sep. 1, 1994, San Jose, California, pp. 195-202.

Rukavina, J., "Attachment Methodologies: Ball Grid Array Technology", *Ball Grid Array National Symposium*, Dallas, Texas, Mar. 29-30, 1995, 36 pages.

Sack, T., "Inspection Technology", *Ball Grid Array National Symposium*, Dallas, Texas, Mar. 29-30, 1995, pp. 1-41.

Sakaguchi, H., "BGA Mounting Technology," pp. 1-4, date and source unknown.

Schmolze, C. and Fraser, A., "SPICE Modeling Helps Enhance BGA Performance", *Electronic Packaging & Production*, Jan. 1995, pp. 50-52.

Schueller, R.D. et al., "Performance and Reliability of a Cavity Down Tape BGA Package," *IEEE Electronic Packaging Technology Conference*, 1997, pp. 151-162.

*Semiconductor Group Package Outlines Reference Guide*, Texas Instruments, 1995, entire document submitted.

Shimizu, J., "Plastic Ball Grid Array Coplanrity", *Surface Mount International Conference*, San Jose, California, Aug. 31-Sep. 2, 1993, pp. 86-91.

Sigliano, R., "Using BGA Packages: An Appealing Technology in a QFP and Fine-Pitch Market", *Advanced Packaging*, IHS Publishing Group, Mar./Apr. 1994, pp. 36-39.

Sirois, L., "Dispensing for BGA: Automated Liquid Dispensing in a High-Density Environment", *Advanced Packaging*, IHS Publishing Group, May/Jun. 1995, pp. 38 and 41.

Solberg, V., "Interconnection Structure Preparation: Impact of Material Handling and PCB Surface Finish on SMT Assembly Process Yield", *Ball Grid Array National Symposium*, Dallas Texas, Mar. 29-30, 1995, 9 pages.

"Survival of the Fittest", *Advanced Packaging*, IHS Publishing Group, Mar./Apr. 1995, page unknown.

Thompson, T., "Reliability Assessment of a Thin (Flex) BGA Using a Polyimide Tape Substrate", *International Electronics Manufacturing Technology Symposium*, IEEE, 1999, pp. 207-213.

Tuck, J., "BGA Technology Branches Out", *Circuits Assembly*, Feb. 1995, vol. 6, No. 2, pp. 24, 26, and 28.

"Tutorials and Short Courses", *45th Electronic Components & Technology Conference*, May 21-24, 1995, Las Vegas, Nevada, IEEE, 4 pages.

Vardaman, E. J. and Crowley, R.T., "Worldwide Trends in Ball Grid Array Developments", *National Electronic Packaging and Production Conference West '96*, Reed Exhibition Companies, Anaheim, CA, Feb. 25-29, 1996, pp. 699-701.

Walshak, D. and Hashemi, H., "BGA Technology: Current and Future Direction for Plastic, Ceramic and Tape BGAs", *Surface Mount International Conference Proceedings*, Surface Mount International, Aug. 28-Sep. 1, 1994, San Jose, California, pp. 157-163.

Walshak, D. and Hashemi, H., "Thermal Modeling of a Multichip BGA Package", *National Electronic Packaging and Production Conference West '94*, Reed Exhibition Companies, Anaheim, California, Feb. 27-Mar. 4, 1994, pp. 1266-1276.

Xie, H. et al., "Thermal Solutions to Pentium Processors in TCP in Notebooks and Sub-Notebooks", *45th Electronic Components & Technology Conference*, IEEE, Las Vegas, NV, May 21-24, 1995, pp. 201-210.

Yip, W.Y., "Package Characterization of a 313 Pin BGA", *National Electronic Packaging and Production Conference West '95*, Reed Exhibition Companies, Feb. 26-Mar. 2, 1995, Anaheim, California, pp. 1530-1541.

Zamborsky, E., "BGAs in the Assembly Process", *Circuits Assembly*, Feb. 1995, vol. 6, No. 2, pp. 60, 62-64.

Zhao, Z., Ph.D., "IC Package Thermal Issues and Thermal Design," ASAT, Inc., Jan. 14, 2000, 98 pages, presented at $2^{nd}$ *International Icepak User's Group Meeting*, Palo Alto, CA, on Feb. 7, 2000.

Zhao, Z., Ph.D., "Thermal Design and Modeling of Packages," *IEEE Short Courses*, Broadcom Corporation, Oct. 25, 2000, 95 pages.

Zimerman, M., "High Performance BGA Molded Packages for MCM Application", *Surface Mount International Conference Proceedings*, Surface Mount International, Aug. 28-Sep. 1, 1994, San Jose, California, pp. 175-180.

Zweig, G., "BGAs: Inspect the Process, Not the Product", *Electronic Packaging & Production (Special Supplement)*, Cahners Publishing Company, Aug. 1994 (Supplement), p. 41.

Freyman, B. and Petrucci, M., "High-Pincount PBGAs: Implementation Into Volume Manufacturing," *Advanced Packaging*, An IHS Group Publication, May/Jun. 1995, pp. 44-46.

English-language Abstract of FR 2803098, published Jun. 29, 2001, 1 page, printed from http://v3.espacenet.com.

Amkor package data sheet, "SuperFC®", from http://www.amkor.com/Products/all_datasheets/superfc.pdf, 2 pages (Jan. 2003).

Andros, F., "Tape Ball Grid Array," from Puttlitz, K.J. and Totta, P.A. (eds.), *Area Array Interconnection Handbook*, pp. 619-620, ISBN No. 0-7923-7919-5, Kluwer Academic Publishers (2001).

Brofman, P.J. et al., "Flip-Chip Die Attach Technology," Puttlitz, K.J. and Totta, P.A. (eds.), *Area Array Interconnection Handbook*, pp. 315-349, ISBN No. 0-7923-7919-5, Kluwer Academic Publishers (2001).

Ghosal, B. et al., "Ceramic and Plastic Pin Grid Array Technology," Puttlitz, K.J. and Totta, P.A. (eds.), *Area Array Interconnection Handbook*, pp. 551-576, ISBN No. 0-7923-7919-5, Kluwer Academic Publishers (2001).

Harper, C.A. (ed.), *Electronic Packaging and Interconnection Handbook*, Third Edition, pp. 7.58-7.59 and 7.61-7.67, ISBN No. 0-07-134745-3, McGraw-Hill Companies (2000).

Lin, S. and Chang, N., "Challenges in Power-Ground Integrity," *Proceedings of the 2001 International Conference on Computer-Aided Design*, pp. 651-654 (Nov. 4-8, 2001).

Lloyd, J. and Overhauser, D., "Electromigration wreaks havoc on IC design," *EDN*, pp. 145-148 (Mar. 26, 1998).

Song, W.S. and Glasser, L.A., "Power Distribution Techniques for VLSI Circuits," *IEEE Journal of Solid-State Circuits*, vol. SC-21, No. 1, pp. 150-156 (Feb. 1986).

Tang, K.T. and Friedman, E.G., "Simultaneous Switching Noise in On-Chip CMOS Power Distribution Networks," *IEEE Transactions on Very Large Scale Integration (VLSI) Systems*, vol. 10, No. 4, pp. 487-493 (Aug. 2002).

Zhao et al., U.S. Appl. No. 11/253,714, filed Oct. 20, 2005, entitled "Methods and Apparatus for Improved Thermal Performance and Electromagnetic Interference (EMI) Shielding in Leadframe Integrated Circuit (IC) Packages".

Office Action as as cited in Application No. 06026677.2-2203 dated Apr. 26, 2011, 5 pages.

\* cited by examiner

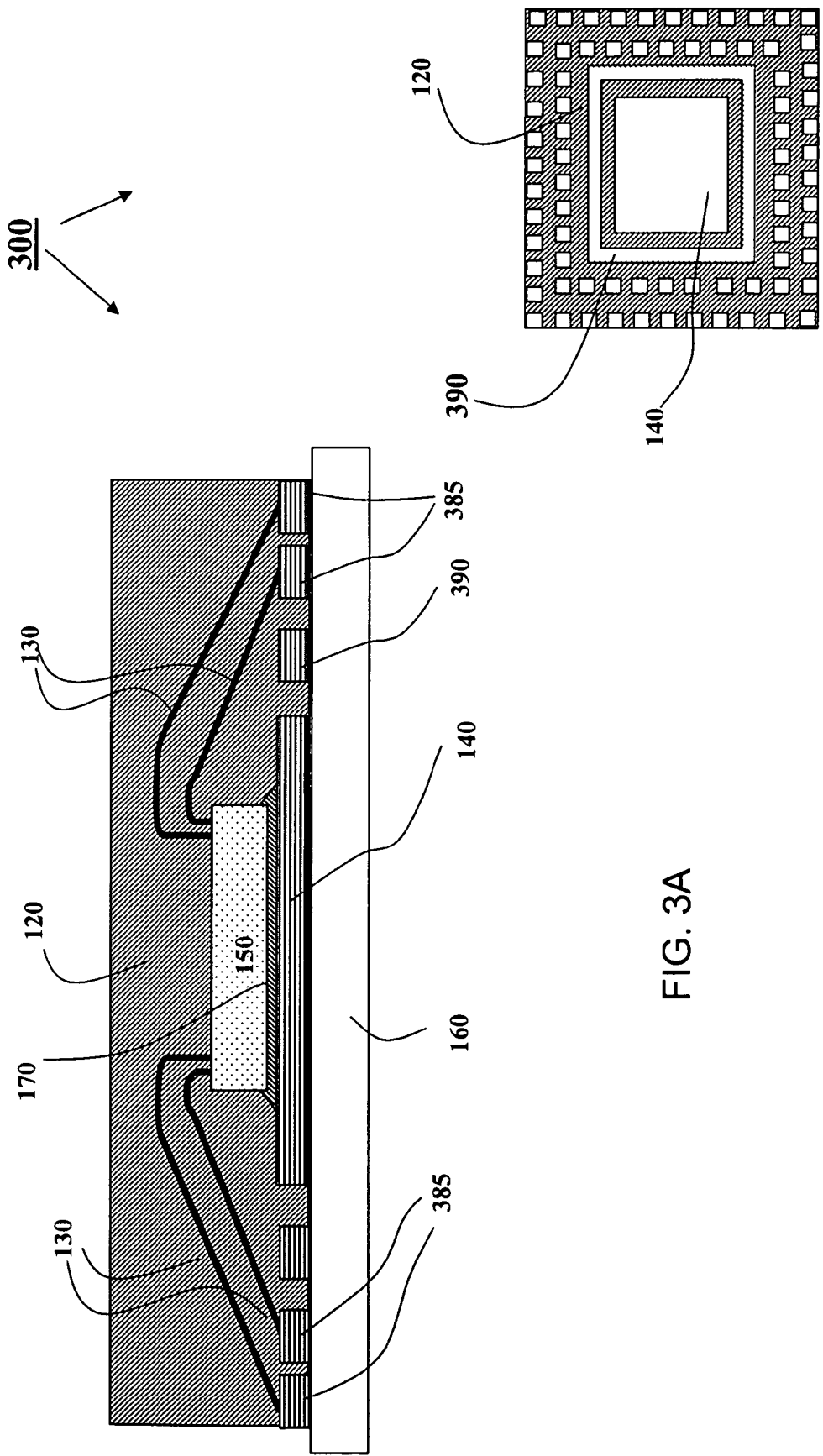

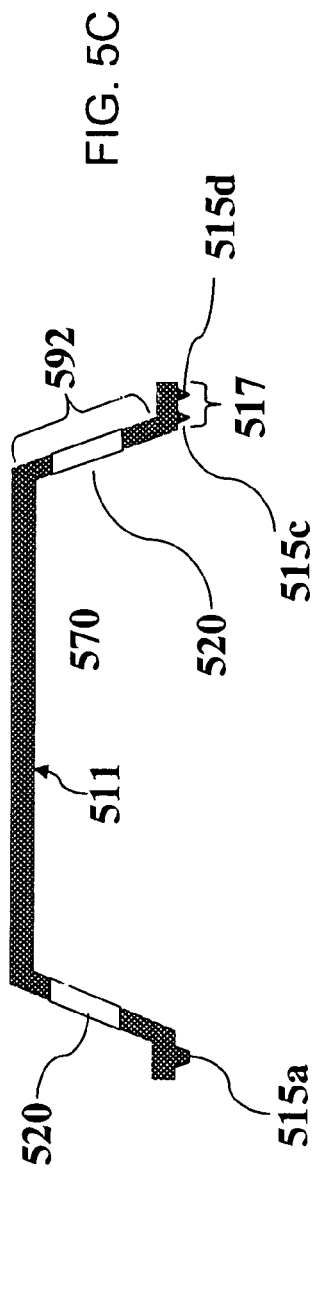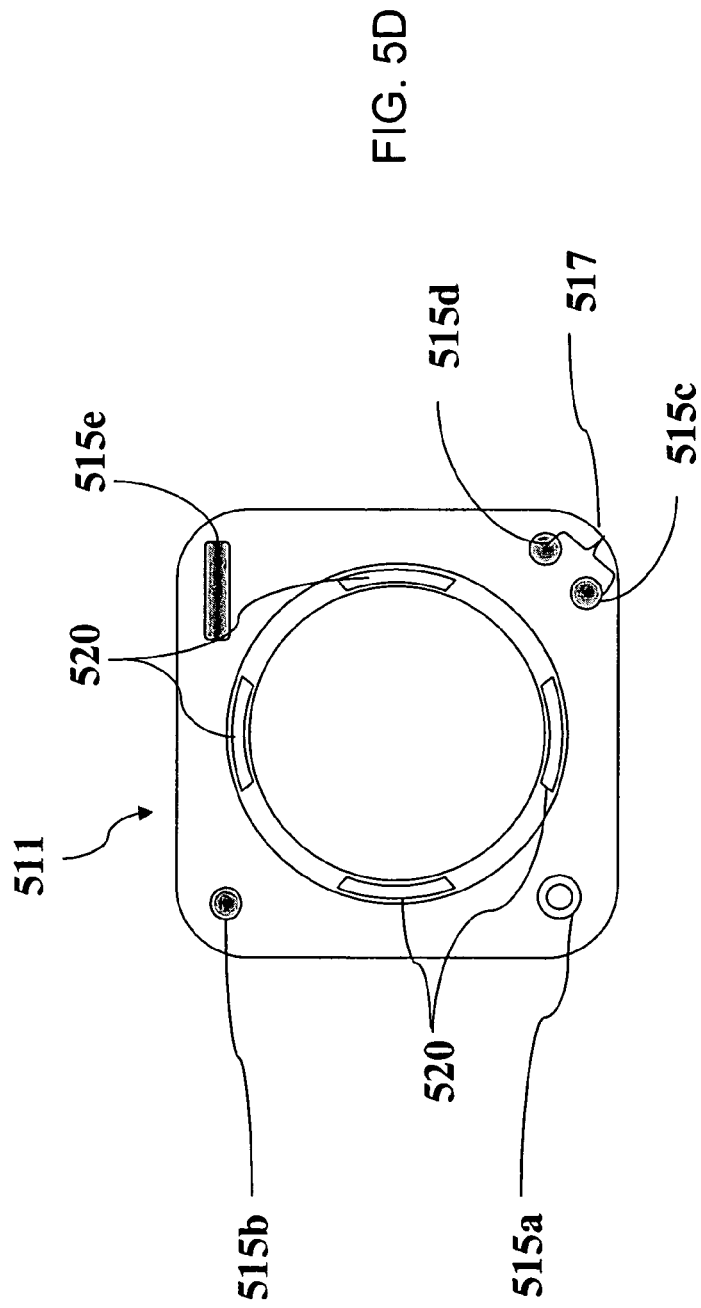

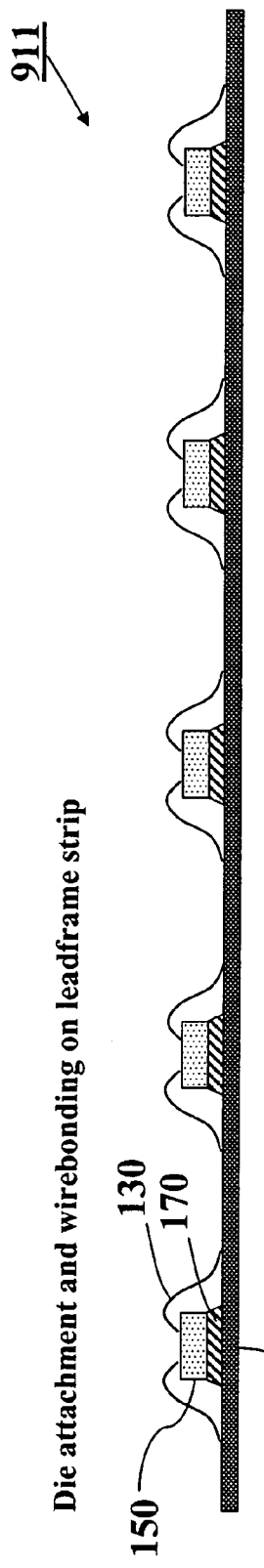
FIG. 9E Die attachment and wirebonding on leadframe strip
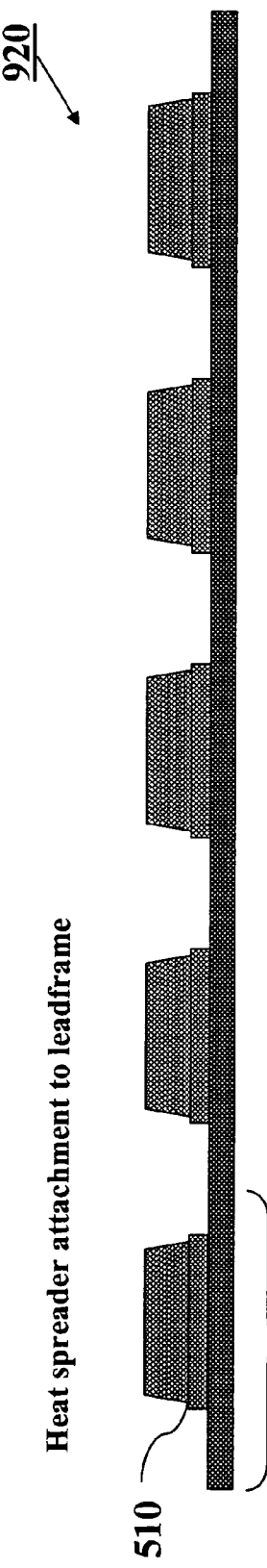
FIG. 9F Heat spreader attachment to leadframe
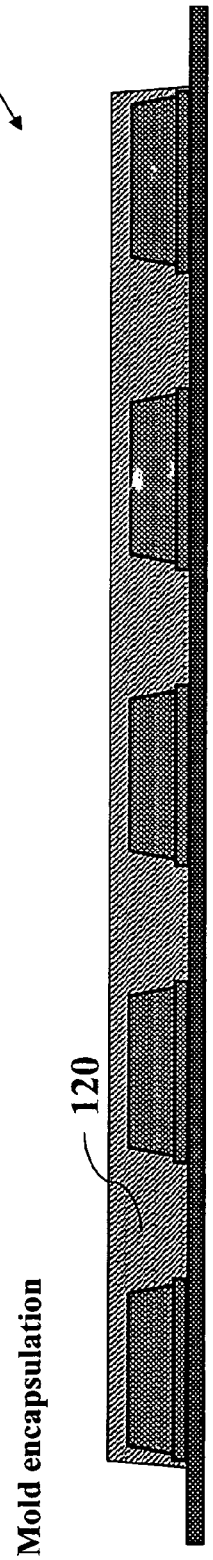
FIG. 9G Mold encapsulation

NO-LEAD IC PACKAGES HAVING INTEGRATED HEAT SPREADER FOR ELECTROMAGNETIC INTERFERENCE (EMI) SHIELDING AND THERMAL ENHANCEMENT

CROSS-REFERENCE TO RELATED APPLICATIONS

The present application claims the benefit of U.S. Provisional Patent Application No. 60/800,433 filed on May 16, 2006, which is incorporated herein by reference in its entirety.

The following patent applications of common assignee are herein incorporated by reference in their entirety:

"Methods and Apparatus for Improved Thermal Performance and Electromagnetic Interference (EMI) Shielding in Leadframe Integrated Circuit (IC) Packages", U.S. patent application Ser. No. 11/253,714, filed Oct. 20, 2005.

"Apparatus and Method for Thermal and Electromagnetic Interference (EMI) Shielding Enhancement in Die-Up Array Packages", U.S. Patent Publication No. 2005-0280127 A1, filed Jun. 21, 2004.

BACKGROUND OF THE INVENTION

Field of the Invention

The invention relates generally to the field of integrated circuit (IC) device packaging technology, and more particularly to thermal enhancement and electromagnetic interference (EMI) shielding in no-lead packages for IC devices.

BACKGROUND

Integrated circuit (IC) semiconductor chips or dies are typically mounted in or on a package that is attached to a printed circuit board (PCB) or printed wire board (PWB). The structural frame, typically made of metal or some other conductor, to which semiconductor dies are attached during the package assembly process is known as a leadframe. A leadframe is widely used in IC packages as a carrier for the IC die and as an interconnection mechanism between the die and the electrical circuits of the PCB/PWB. A leadframe can have positions allocated for housing multiple IC dies. After dies are attached to the leadframe, metal wires are used to connect the IC die bond pads to the leadframe bond pads, which are sometimes known as bond fingers. Then the positions on the leadframe where dies are located are encapsulated in a molding compound, such as thermoset epoxy. After molding, encapsulated chips are mechanically broken loose from the leadframe rails. If parts of the leadframe protrude from the package, the package is called a leaded package. In contrast, if the package leads do not substantially protrude from the leadframe footprint, then the package is called a no-lead leadframe package or simply, a no-lead package or leadless package. In a no-lead package, straight or bended leads are bent downwards and/or inwards to be mounted on a PCB/PWB substrate.

A variation of a no-lead leadframe package has an exposed die attach pad (DAP). The exposed DAP has a solderable outer surface opposite to the die attach surface which can be solder attached to a PCB/PWB. Another alternative no-lead package is known as a Thin Array Plastic Package (TAPP), which has multiple rows of peripheral leads for wire bonding.

Various packages with and without a leadframe have been developed and package family outlines have been standardized by the Electronic Industries Alliance (EIA), the Joint Electron Device Engineering Council (JEDEC), and the Electronic Industries Alliance of Japan (EIAJ).

Commercially available no-lead packages have limited thermal performance and poor EMI shielding. Thus, what is needed is reduced EMI susceptibility, in combination with improved thermal and electrical performances in integrated circuit packages. Furthermore, enhanced environmental protection is also desirable for integrated circuit packages.

BRIEF SUMMARY OF THE INVENTION

The present invention is directed to methods and apparatus for improved thermal performance and EMI shielding in IC packages.

In an aspect of the present invention, an IC device package includes a cap having opposing first and second surfaces. A first portion of the second surface of the cap has a cavity formed therein. A planar second portion of the second surface of the cap is coupled to a DAP. The DAP has a central portion, and a plurality of tie bars coupled to the central portion of the DAP. An IC die is mounted to the central portion of the DAP. The cap and the DAP form an encasing structure that substantially encloses the IC die(s).

In another aspect of the present invention, an IC device package is assembled. A leadframe tailored for a no-lead package is formed. An IC die is attached to a central portion of the die attach pad of the leadframe. Wire bonds are coupled between the IC die and the leadframe. A cap is attached to the leadframe. A second surface of the cap includes a cavity. The cap and the leadframe form an encasing structure that substantially encloses the IC die. A molding material is applied to encapsulate the IC die. A perimeter support ring portion of the leadframe is trimmed. Portions of the leads are bent to aid coupling of the leads to a circuit board. The encasing structure spreads heat from the IC die(s) during operation. Furthermore, the encasing structure shields EMI emanating from the IC die(s) and EMI radiating toward the IC die(s) from outside the package.

These and other advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 1A, 1B, 2A, 2B, 3A, and 3B show cross-sectional and bottom views of various types of IC packages with exposed DAP for improved thermal performance.

FIGS. 5A-5F show examples of caps according to embodiments of the invention.

FIGS. 9E-9G show side views of examples of leadframe IC packages undergoing assembly, according to embodiments of the invention.

Figure 1B:
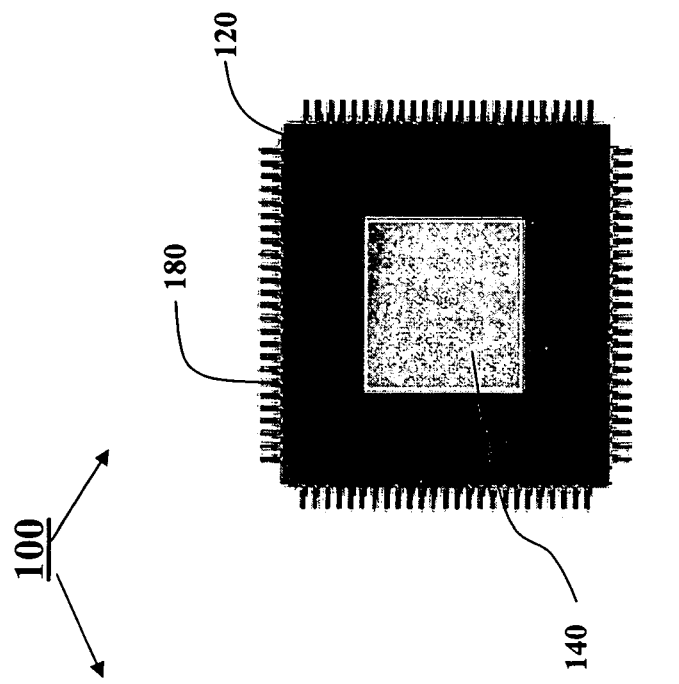

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Overview

The present invention is directed to methods and apparatus for improving thermal performance and electromagnetic interference (EMI) shielding in integrated circuit (IC) packages. An IC die is mounted to a DAP. The IC die may be mounted in a die-up configuration, where the die is attached to a surface of the DAP that is facing away from a board (such as a PCB). The IC die may also be mounted in a die-down configuration, where the die is attached to a surface of the DAP that is facing towards the board. Wire bonds may be used to electrically connect bond pads patterned on the die to lead fingers surrounding the DAP. Note that the base region of a lead to which a wire bond is connected is referred to as a "lead finger".

In a no-lead IC package, leads do not protrude substantially from their respective base regions. Leads are bent downwards to be mounted on a PCB/PWB, resulting in a compact footprint of the packaged IC die, sometimes referred to as an "IC chip". This type of package is called "Chip Scale Package" or CSP. CSP can be leadframe based, where the DAP and the leads are coupled as a leadframe, and one or more perimeter support rings or dam bars structurally connect the leads. This type of package is called a no-lead leadframe package. Typical examples of no-lead leadframe packages are "Leadless Plastic Chip Carrier" or LPCC, and "Micro Leadframe Package" or MLP, where there is typically a single row of peripheral terminals.

An example of a non-leadframe based CSP is a TAPP package, which has multiple rows of peripheral leads for wire bonding. TAPP packages are assembled with a unique process that allows for multi-row peripheral outputs as well as ground or power interposer rings. The packages are extremely thin with a nominal thickness in the range of 0.7 mm, and Input/Output (I/O) densities comparable with fine pitch Ball Grid Array (fpBGA) packages. Note that a modified version of a TAPP-type package can be assembled from an appropriately designed leadframe having multiple peripheral lead rows, where each of the rows have a corresponding perimeter support ring. One or more interposer ground/power rings may also be coupled to the DAP.

A metal cap is coupled (e.g. electrically, structurally, and/or thermally connected) to the DAP to form an encasing structure. The coupling may be effected with or without the use of a thermally and/or electrically conductive adhesive, such as solder or epoxy with metal particles or flakes. In one embodiment, the cap is coupled to the tie bars attaching one or more leads to the DAP. The tie bars may be widened or fused to leads. In another embodiment, the cap is coupled to the leads. In yet another embodiment, the cap is coupled to the DAP. The cap may be coupled with any combination of DAP, leads, and tie bars. Tabs on the cap mate with matching receptacles on one or more fused leads and/or tie bars to improve coupling and overall structural strength.

The encasing structure formed by a cap and a DAP approximates an equipotential surface, known as a "Faraday Cage", surrounding the die and the interconnections. The encasing structure material is typically a very good conductor of heat, and is relatively rigid (e.g., copper or copper alloy C151). The encasing structure may provide improved EMI shielding, improved heat transfer from the IC die, enhanced rigidity of the package, and improved environmental (e.g., mechanical shock, vibration, impact, stress, temperature, moisture, corrosion, etc.) protection.

In one embodiment, the die and the wire bond are encapsulated in a molding material, which provides environmental protection. The molding material may also completely cover the cap. In other embodiments, the cap is partially covered, or is not covered by the molding material.

Example Integrated Circuit Packages

Different families of leadframe-based leaded and no-lead packages are discussed in C. A. Harper, Electronic Packaging and Interconnection Handbook, $3^{rd}$ edition, McGraw-Hill, New York, pp. 7.61-7.67, 2000, which is incorporated by reference herein in its entirety.

Common plastic molding compound encapsulated leadframe packages (an example of which is a Plastic Quad Flat Pack or PQFP) exhibit poor thermal performance, because there is no continuous heat dissipation path between the DAP and the leads. Heat generated on the active surface of the IC die is dissipated primarily through the top and bottom surfaces of the package. The leadframe conducts some heat into a PCB/PWB to which the package is attached. The molding material that encapsulates the IC die transfers some heat to the environment through various convection paths and radiation paths. Typical molding materials have a low thermal conductivity value, such as around or between 0.2~0.9 W/m·K. Therefore, molding materials in conventional leadframe packages impose the primary bottleneck for heat dissipation from the die to the external surfaces and terminal leads of the package.

Thermal performance of leaded and no-lead leadframe packages can be improved by exposing the DAP at the bottom surface of molding material.

Figure 1A:
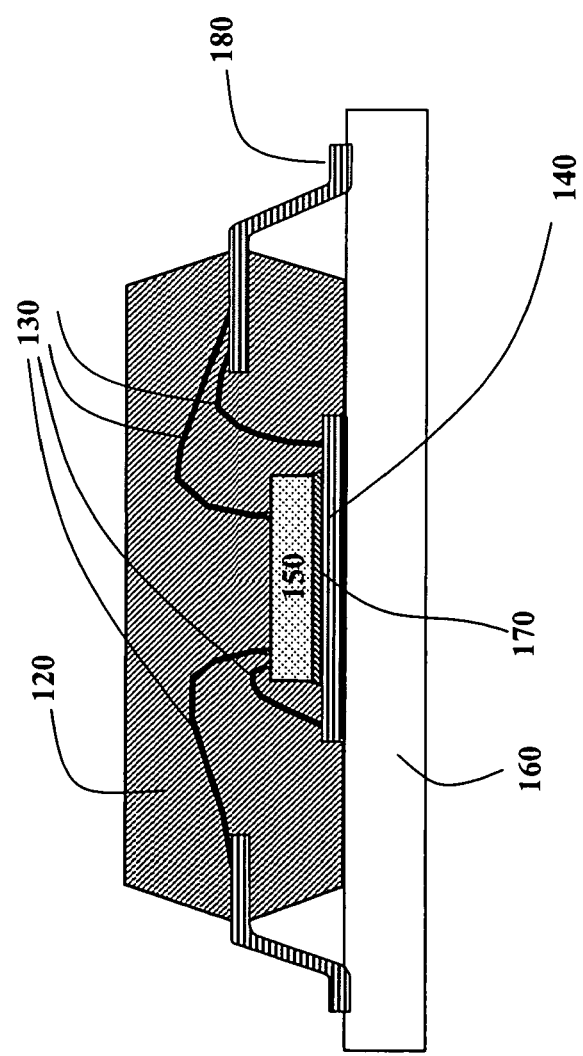

FIGS. 1A and 1B are respectively side and bottom views of a leaded PQFP package 100 with an exposed DAP. Package 100 comprises IC die 150, DAP 140, wirebonds 130, molding material 120, adhesive 170, and package leads 180. DAP 140 and package leads 180 may be part of a leadframe. IC die 150 is mounted on DAP 140 with adhesive 170. Molding material 120 encapsulates IC die 150 and wirebonds 130. Wirebonds 130 connect the bond pads on IC die 150 to package leads 180. Additional wirebonds 130 may be formed between the IC die and DAP 140, and DAP 140 and leads 180, as shown in FIG. 1A, and DAP 140 has at least a portion of its outer surface exposed. A thermally conducting solder/adhesive coating on the exposed surface of DAP 140 bonds package 100 to a PCB/PWB 160. PCB/PWB 160 acts as a heat spreader for the package, as the heat generated on the active surface of die 150 is dissipated into PCB/PWB 160 with very low conductive thermal resistances. This type of package is referred to as an "Exposed Pad Thin Quad Flat Pack" or eTQFP package.

Figures 2A, 2B:
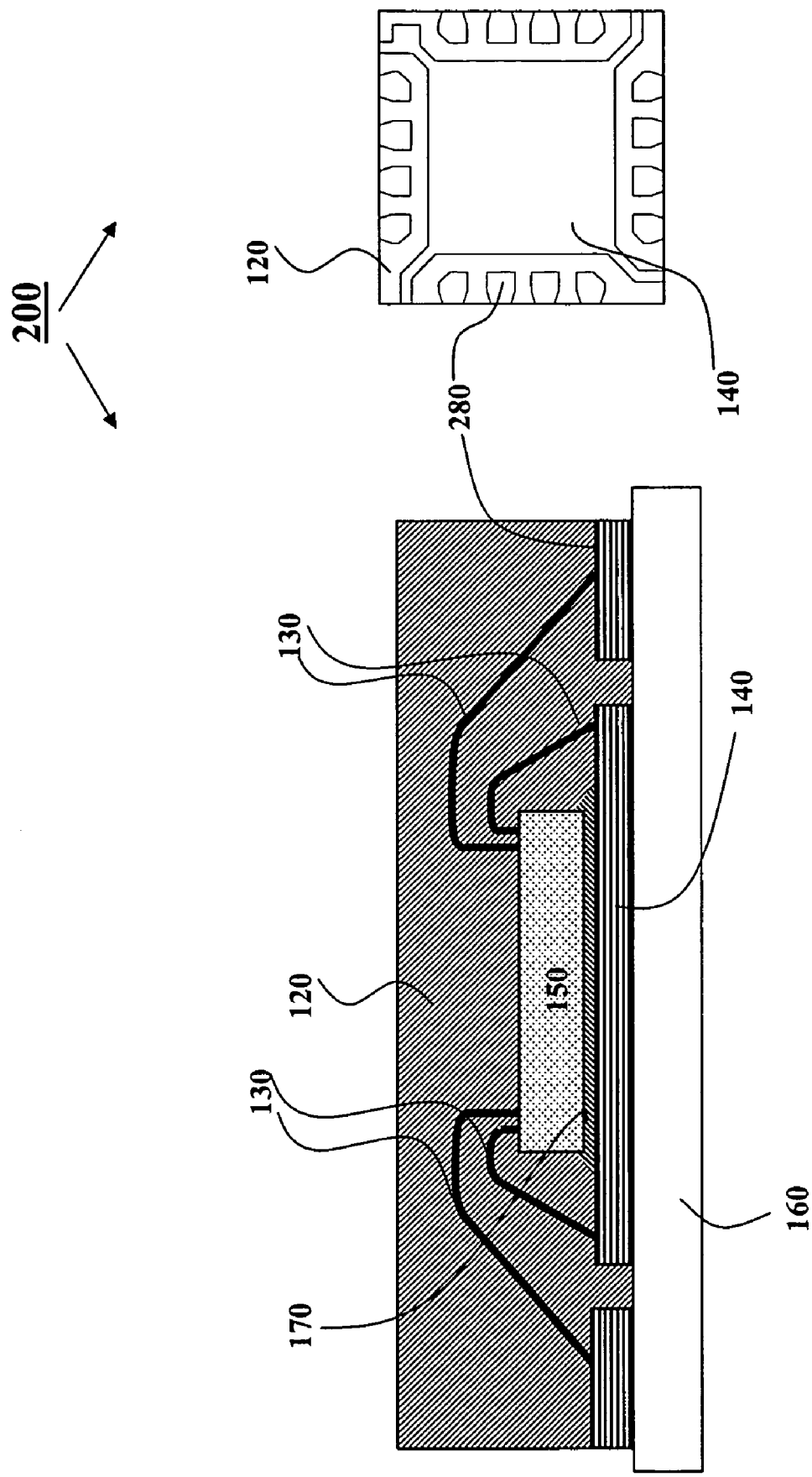

FIGS. 2A and 2B are respectively side and bottom views of a no-lead leadframe package 200 with exposed DAP 140. Package 200 comprises IC die 150, DAP 140, wirebonds 130, molding material 120, adhesive 170, and package leads 280. DAP 140 and package leads 280 may be part of a leadframe. IC die 150 is mounted on DAP 140 with adhesive 170. Molding material 120 encapsulates IC die 150 and wire bonds 130. At least a portion of the outer surface of DAP 140 is coated with a thermally conducting solder or adhesive, which bonds package 200 to a PCB/PWB 160. This type of package is referred to as a "Micro Leadframe Package" or MLP, also known as a "Quad Flat No-Lead" or QFN package, as package leads 280 do not protrude substantially from the package outline. Package leads 280 surround DAP 140. In a no-lead package such as package 200, typically, there is only one row of peripheral leads. Wire bonds 130 connect leads 280 to bond pads on IC die 150. DAP 140 may be connected to ground potential or a certain power potential.

FIGS. 3A and 3B are respectively side and bottom views of a no-lead TAPP-type package 300 with exposed DAP 140. Package 300 comprises IC die 150, DAP 140, wirebonds 130, molding material 120, adhesive 170, interposer ring 390, and package leads 385. The outer surface of DAP 140 is coated with a thermally conducting solder or adhesive, which bonds package 300 to a PCB/PWB 160. Leads 385 surround DAP 140 in more than one row forming an array of output leads. Wire bonds 130 connect leads 385 to corresponding bond pads on IC die 150. Having multiple rows of package leads increases I/O density of the packaged circuit. Additionally, one or more interposer rings 390 may be included in the package. Interposer ring 390 is typically coupled to ground potential. Note that interposer ring 390 does not necessarily have to be connected to ground. It can be connected to a certain power potential as well. TAPP packages have a unique assembly process. However, as mentioned earlier, TAPP-type packages can have a leadframe-based assembly process, if the leadframe design is modified to include interposer rings and multiple peripheral lead rows.

Though the above described packages show improvement in thermal performance, they exhibit poor electromagnetic interference (EMI) shielding. A change in the electrical current carried by a conductor results in the radiation of electromagnetic waves. Such waves propagate through space at the speed of light, and when not wanted, are called EMI. A relatively slow change in the electrical current causes a small amount of electromagnetic radiation with a long wavelength and a low frequency. A relatively rapid change in the electrical current causes a large amount of radiation with a short wavelength and a high frequency. The unwanted high frequency electromagnetic radiation is sometimes called radio-frequency interference (RFI), but in the interest of brevity, this document refers to all unwanted electromagnetic radiation as EMI, regardless of frequency.

IC die 150 is more susceptible to higher frequency EMI. Because higher frequencies are more energetic, they may cause larger voltage swings in the metal traces on an IC die. Because modern IC gates are small in size, they operate with a low signal voltage. Thus, signal line voltage swings caused by high-frequency EMI may cause a change in logic state and may result in timing and logic failures in electronic devices.

Molding materials 120 are typically transparent to electromagnetic radiation. Referring to FIG. 1A, electromagnetic radiation generated by die 150 will escape from package 100 and potentially interfere with the operation of nearby components. Conversely, EMI from nearby components will enter package 100 and may interfere with the operation of die 150.

Figure 4:
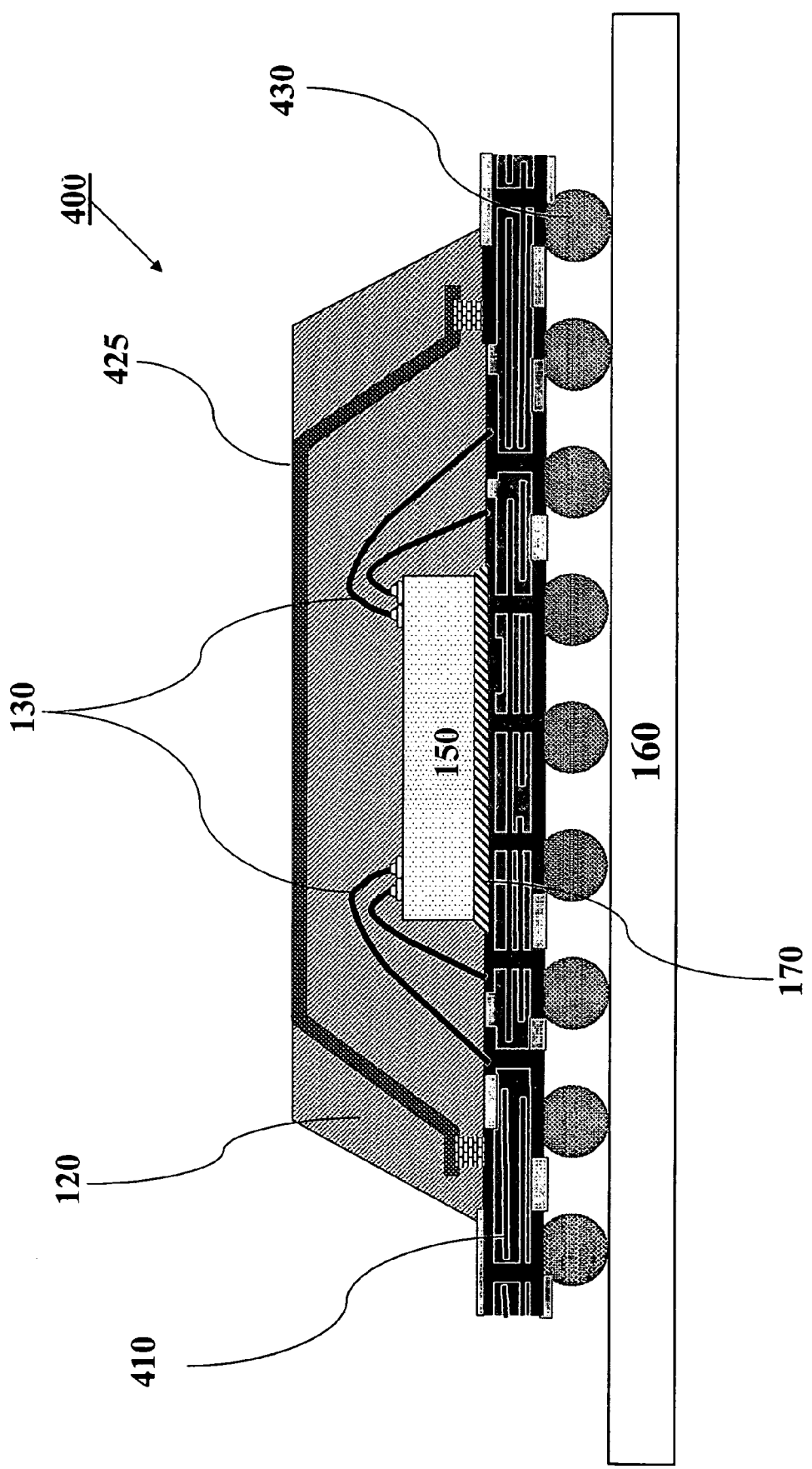
FIG. 4 illustrates an example ball grid array (BGA) IC package.

Various package configurations have been considered to address the thermal and EMI issues. FIG. 4 illustrates an example BGA package having improved thermal performance, and somewhat improved EMI shielding. FIG. 4 shows a cross-sectional view of a BGA package 400 with an IC die 150 mounted on a printed circuit substrate 410 with adhesive 170. Wirebonds 130 and IC die 150 are encapsulated by a molding material 120. IC die 150 is electrically connected to PCB/PWB 160 through solder balls 430. BGA package 400 includes a drop-in heat spreader 425 to promote dissipation of heat within molding material 120. However, direct contact between IC die 150 and heat spreader 425 is not permitted in package 400. Accordingly, heat generated by IC die 150 must pass through molding material 120 in order to reach heat spreader 425, and may therefore remain trapped within BGA package 400. Furthermore, drop-in heat spreader 425 only provides limited EMI shielding, if any. For example, EMI generated outside BGA package 400 can penetrate printed circuit substrate 410 and interfere with the operation of IC die 150. Also, EMI generated by IC die 150 can escape BGA package 400 through trace metal openings or gaps in printed circuit substrate 410.

Different types of heat spreader designs are discussed in various references, such as U.S. Pat. No. 5,977,626, "Thermally and Electrically Enhanced PBGA Package," to Wang et al., U.S. Pat. No. 6,552,428 "Semiconductor Package Having An Exposed Heat Spreader" to Huang et al., U.S. Patent Pub. No. 20030057550-A1, entitled "Ball Grid Array Package Enhanced with a Thermal and Electrical Connector", U.S. Patent Publication No. 2005-0280127 A1, titled "Apparatus And Method For Thermal And Electromagnetic Interference (EMI) Shielding Enhancement In Die-Up Array Packages", all of which are incorporated by reference herein in their entireties.

A variety of EMI shielding designs are also proposed in various references, such as U.S. Pat. No. 5,294,826, titled "Integrated Circuit Package and Assembly Thereof for Thermal and EMI Management," and U.S. Pat. No. 5,650,659, titled "Semiconductor Component Package Assembly Including an Integral RF/EMI Shield", both of which are incorporated herein in their entireties.

Integrated heat spreaders used in commercially available leadframe packages are either placed against the backside of the DAP (drop-in heat spreader MQFP package, for example), or the DAP of leadframe is removed and replaced by the integrated heat spreader on which the IC die is attached. The IC die is encapsulated together with the integrated heat spreader. While the thermal performance is improved for these integrated heat spreader packages, protection against electromagnetic interference (EMI) has not been provided by the integrated heat spreaders. Additionally, the integrated heat spreaders are all structurally located on the backside of the die. To expose the integrated heat spreader on the top of the package for external heat sink attachment, die-down leadframe package must be used. If an IC die was initially packaged in a conventional die-up package and it was later decided to add a drop-in heat spreader exposed on the package top, the IC die must be redesigned in order to match the pin-out. Therefore, what is needed is a robust drop-in heat spreader integration method that provides EMI shielding of the IC die and can be used for both die-up and die-down leadframe packages.

The present invention enables easy integration of a drop-in heat spreader to leadframe-based no-lead packages and TAPP-type no-lead packages, either in a die-up or in a die-down configuration. In the following sections, the main components of an example no-lead package, i.e. a cap, and a no-lead leadframe, are discussed in detail.

Example Heat Spreader Cap Structures

Example embodiments for improved heat spreader cap structures are described in this section. Further embodiments will become apparent to persons having skill in the relevant art(s) from the teachings herein. Elements of the embodiments described herein can be combined in any manner.

Figure 5A:
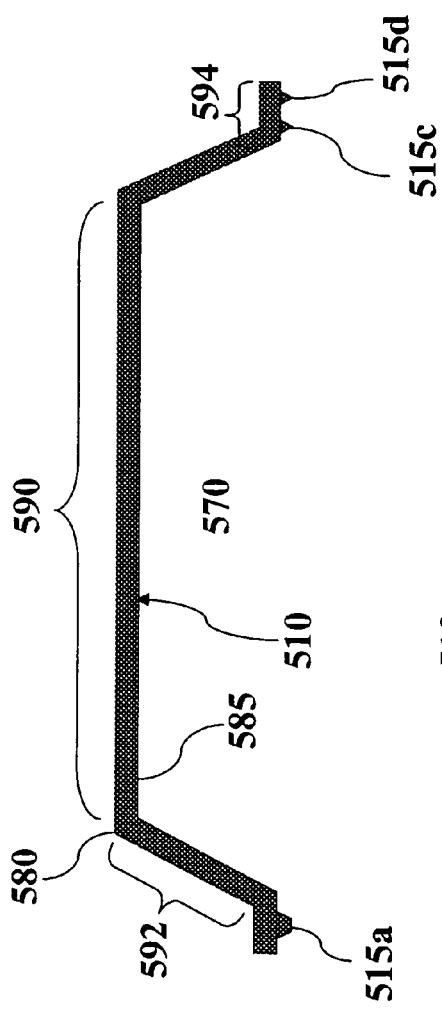
Figure 5B:
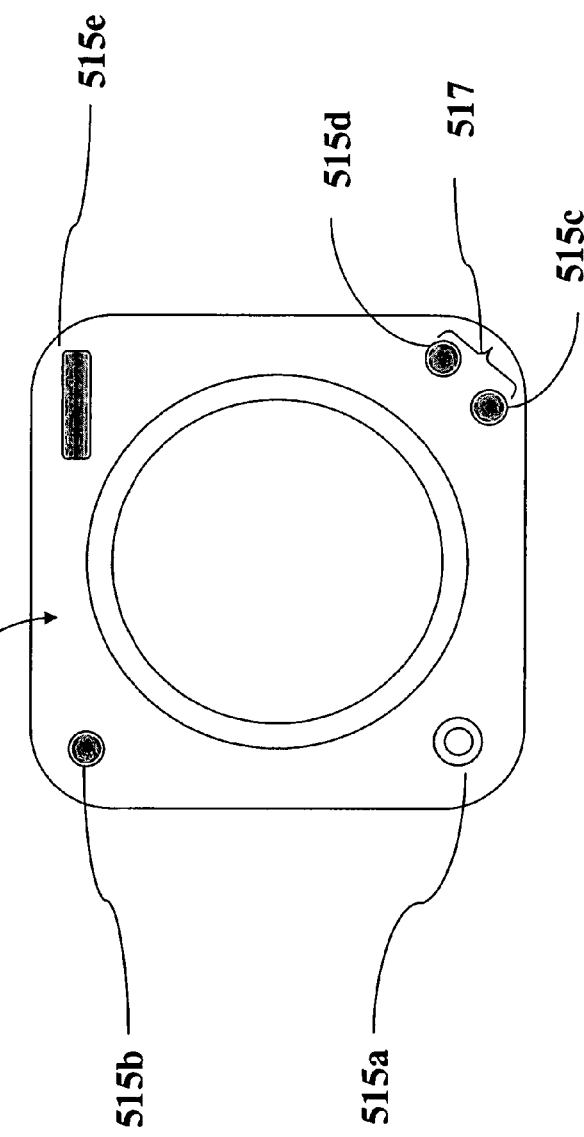
Figure 6A:
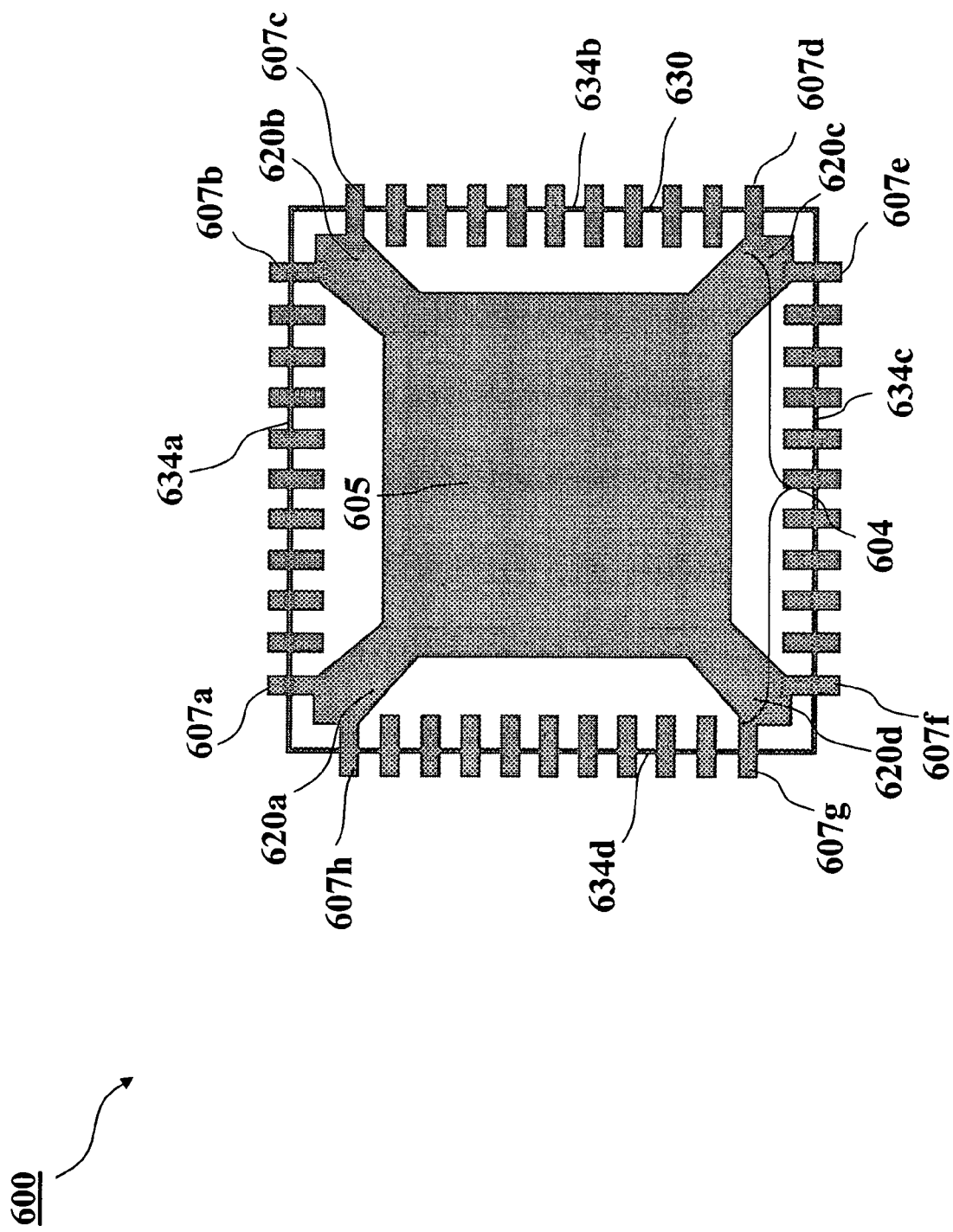
FIGS. 6A-6C show plan views of examples of leadframes according to embodiments of the invention.
Figure 6B:
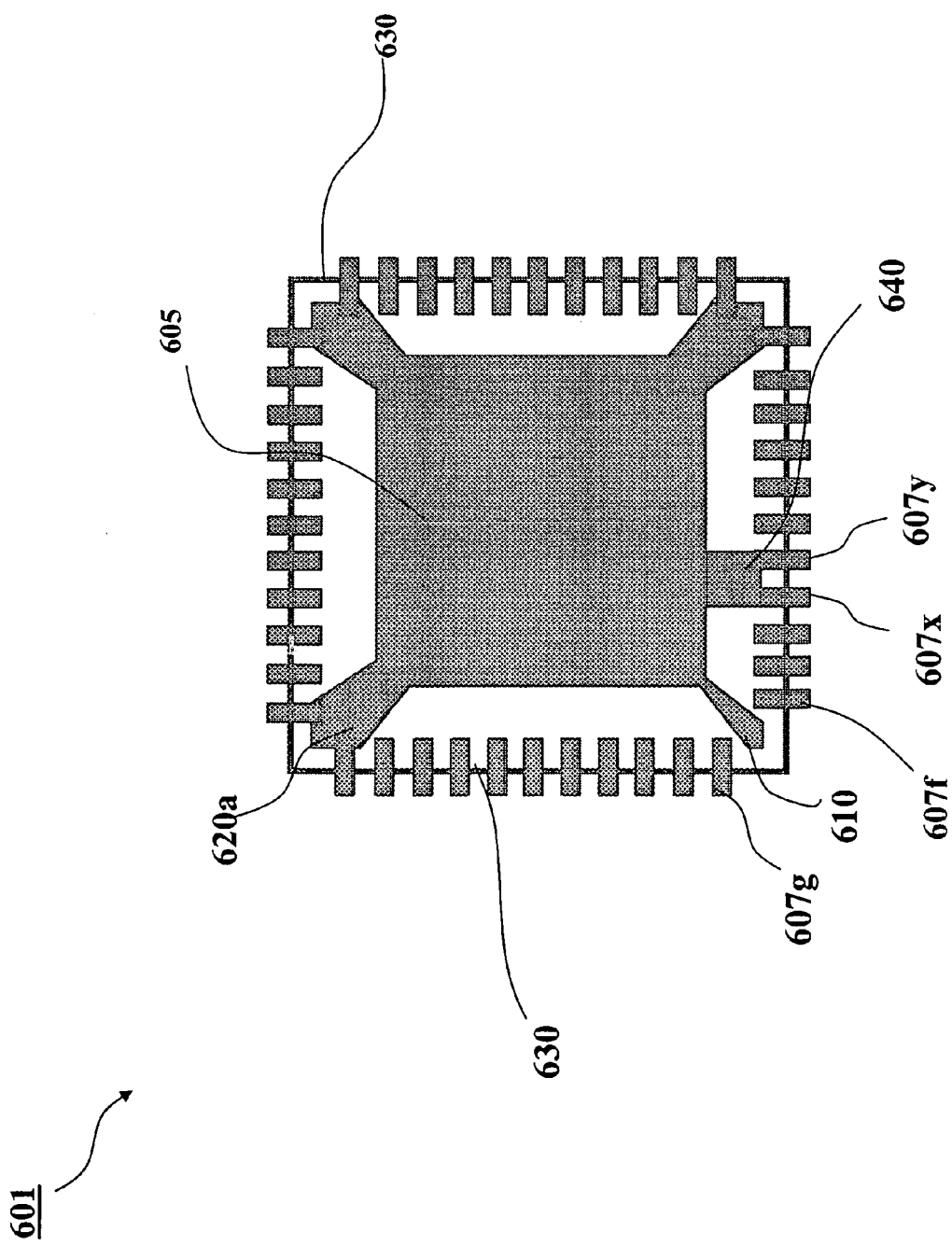
Figure 6C:
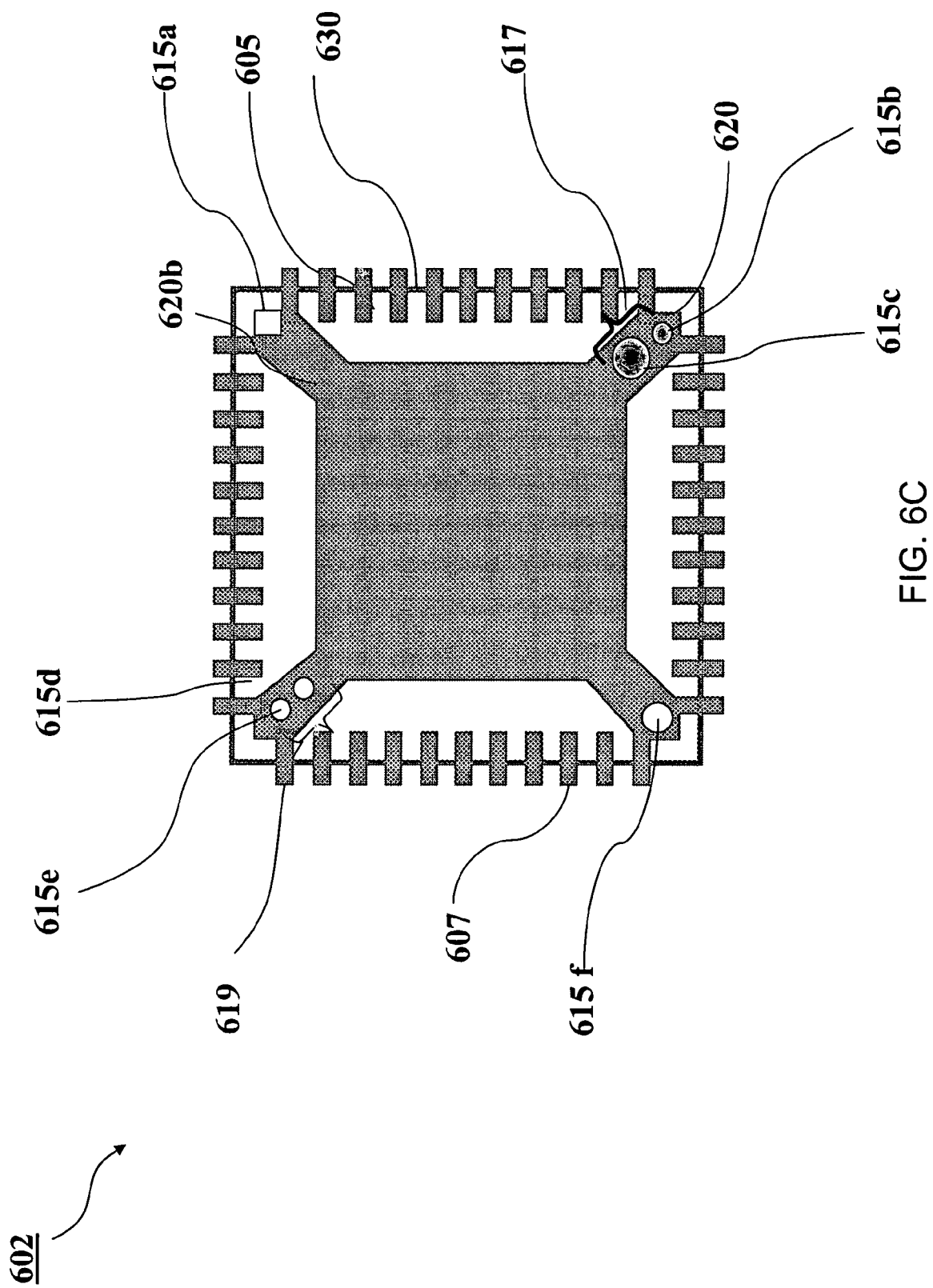

FIG. 5A illustrates a cross sectional view of a cap 510. FIG. 5B illustrates a bottom view of cap 510, in accordance with an embodiment of the present invention. Cap 510 may be incorporated into various integrated circuit packages, such as shown in FIGS. 7A-7F, which are described in detail below. The packages may incorporate leadframes, such as shown in FIGS. 6A-6C, which are described in detail below.

Cap 510 has a top portion 590, a sidewall portion 592, and a rim 594 extending around a bottom periphery of cap 510. It should be noted that references to "top" and "bottom" are merely exemplary for the convenience of description. It is not intended that this invention be limited to any particular spatial orientation.

Sidewall portion 592 couples (e.g., electrically, structurally, and thermally) top portion 590 to rim 594. Further, sidewall portion 592 is angled outward from top portion 590. Although FIG. 5A illustrates a planar top portion 590, top portion 590 can be non-planar (e.g., curved, concave, convex, hemispherical, or other shapes). Additionally, although FIGS. 5A and 5B illustrate an angled-outward sidewall portion 592, sidewall portion 592 may be perpendicular to or angled inward from top portion 590. Furthermore, sidewall portion 592 is not limited to a linear cross-section and may employ other cross-sectional shapes such as convex inward and outward as would be understood by one skilled in the art.

Cap 510 further has a first surface 580 (outer surface) and a second surface 585 (inner surface). Second surface 585 forms an upper boundary of a cavity 570 in a bottom portion of cap 510. Rim 594 surrounds cavity 570. Cavity 570 is shown in FIG. 5A as having a trapezoidal cross section, but may have other shapes (e.g., square, rectangular, irregular, etc.). Although FIG. 5B illustrates cavity 570 having a circular shape, cavity 570 may have other shapes. Further, cap 510 may have various shapes such as round, rectangular, square, elliptical, oval, or any other shape.

In cap 510, rim 594 may have a substantially planar lip portion. The bottom surface of the lip portion of rim 594 has one or more protruding tabs 515a-e. Tabs 515a-e may have any shape. For example, FIGS. 5A and 5B show a frustum tab 515a, a conical tab 515b, a pair 517 of conical tabs 515c and 515d, and an oblong shaped tab 515e. Cap 510 is not limited to the shapes, sizes, locations, or numbers of tabs 515 shown. Cap 510 may also have zero or more tabs of any shape, of any size, in any locations.

The outer periphery dimension of cap 510 is preferably the same size as the periphery, or smaller than the periphery of the substantially planar area enclosed by the peripheral row of leads to facilitate visual inspection of lead interconnect on the PCB/PWB. In an alternative embodiment, the outer periphery dimension of cap 510 extends beyond the periphery of the substantially planar area enclosed by the peripheral row of leads. For manufacturing considerations, the outer periphery of cap 510 is preferably smaller than the dimension of a leadframe perimeter support ring 630 (e.g., see FIG. 6A, further described below). Although cap 510 is illustrated having a particular size, other sizes may be used, as would be understood by persons skilled in the relevant art(s).

In one embodiment, cap 510 may be configured to mount an external heat sink. In another embodiment, cap 510 may be configured to be thermally and/or electrically connected to a PCB/PWB.

Cap 510 may be made of a thermally conductive material and/or an electrically conductive material, such as a metal. For example, the material for cap 510 may include copper, a copper alloy, (e.g., C194, C151, C7025, or EFTEC 64T), aluminum, an aluminum alloy, ferromagnetic materials, laminated copper or iron, etc. Other metals and combinations of metals/alloys, or other thermally and electrically conductive materials (e.g., ceramics, metallized plastics, laminated metal foils on plastic or ceramic, etc.) could also be used. Cap 510 and DAP 140 may be made of the same material or different materials. When cap 510 and DAP 140 are made of the same material, or materials having the same coefficient of thermal expansion, structural integrity may be improved, such as reducing thermal stress on the die (sandwiched between the cap and leadframe). Furthermore, cap 510 may have any thickness, depending on the particular application. For example, cap 510 may have a thickness of 0.1 to 0.5 mm. Alternatively, cap 510 may have a thickness of less than 1.0 mm.

The bottom surface of the lip portion of rim 594 may be fully or partially coated or laminated with a layer of dielectric material (e.g. solder mask, dielectric film etc.). In this manner, the shorting of leads after assembly may be prevented.

In one embodiment, the cap may have openings through the first surface 580 and the second surface 585. For example, FIGS. 5C and 5D show example caps 511 having openings or slots 520 formed in sidewall portions 592. Although FIGS. 5C and 5D illustrate slots 520 in sidewall portion 592 as rectangular or trapezoidal, slots 520 can have other shapes.

Figure 5E:
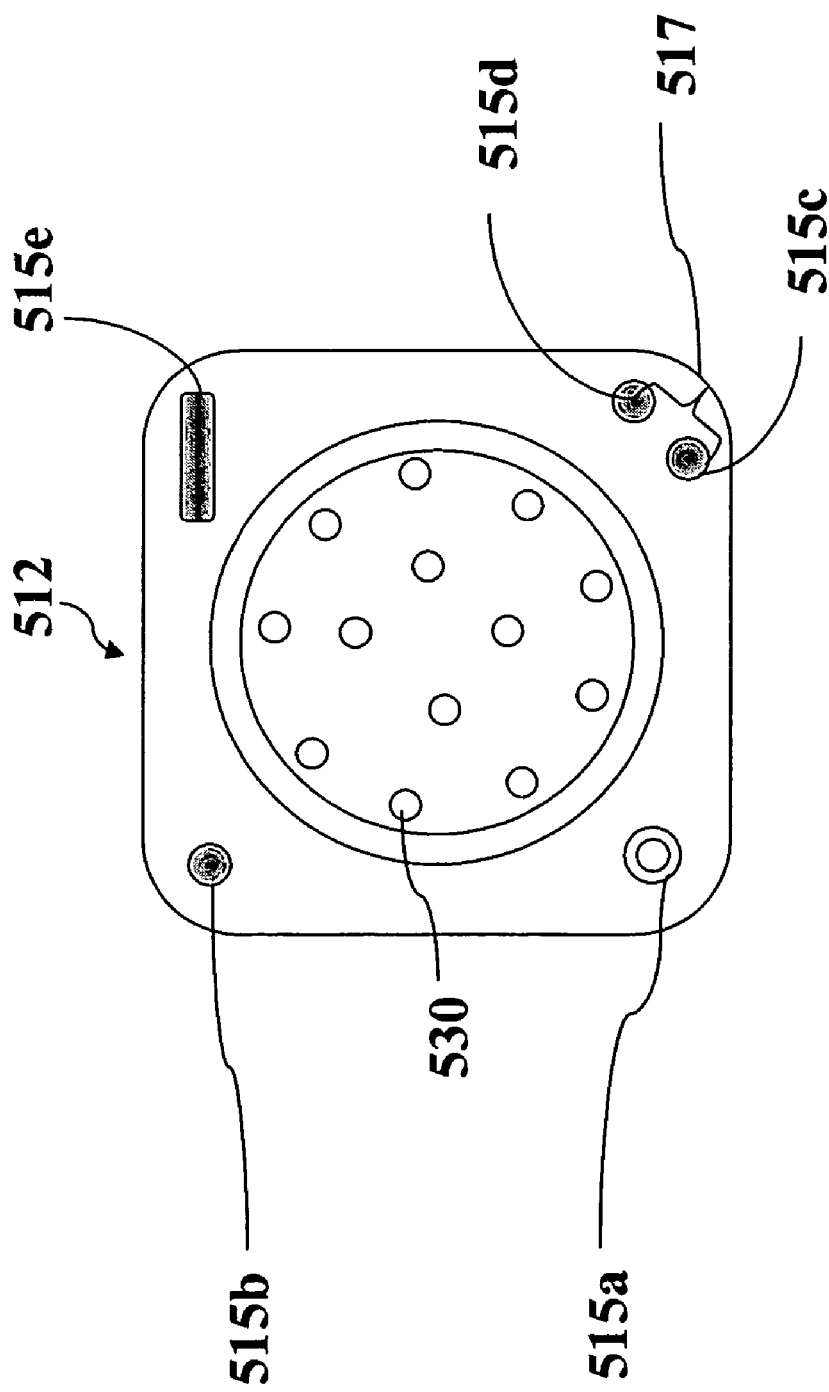

In another embodiment, a cap 512 may have holes/openings 530 in top portion 590 as illustrated in FIG. 5E. Cap 512 may have any number of holes. Furthermore, holes 530 can have any shape.

Holes 530 in cap 512 and slots 520 in cap 511 allow the flow of molding material 120 into cavity 570 during a manufacturing process. Additionally or alternatively, slots 520 and holes 530 may release pressure buildup (during or after manufacture) occurring in cavity 570. Because smaller holes 530 and slots 520 may require a higher pressure to flow or inject molding material 120 into cavity 570, larger holes 530 and slots 520 may be desirable from a manufacturing perspective. However, it may be required that the size of holes 530 and slots 520 to be limited to reduce EMI penetration. A hole 530 or slot 520 diameter may be in the range of 0.5-3.0 mm. A diameter of 1.5 mm may be used to shield against EMI having a highest harmonic frequency of about 10 GHz. An outer surface of cap 510 may be completely or partially encapsulated in molding material 120, or may have no molding material 120 covering it.

Figure 5F:
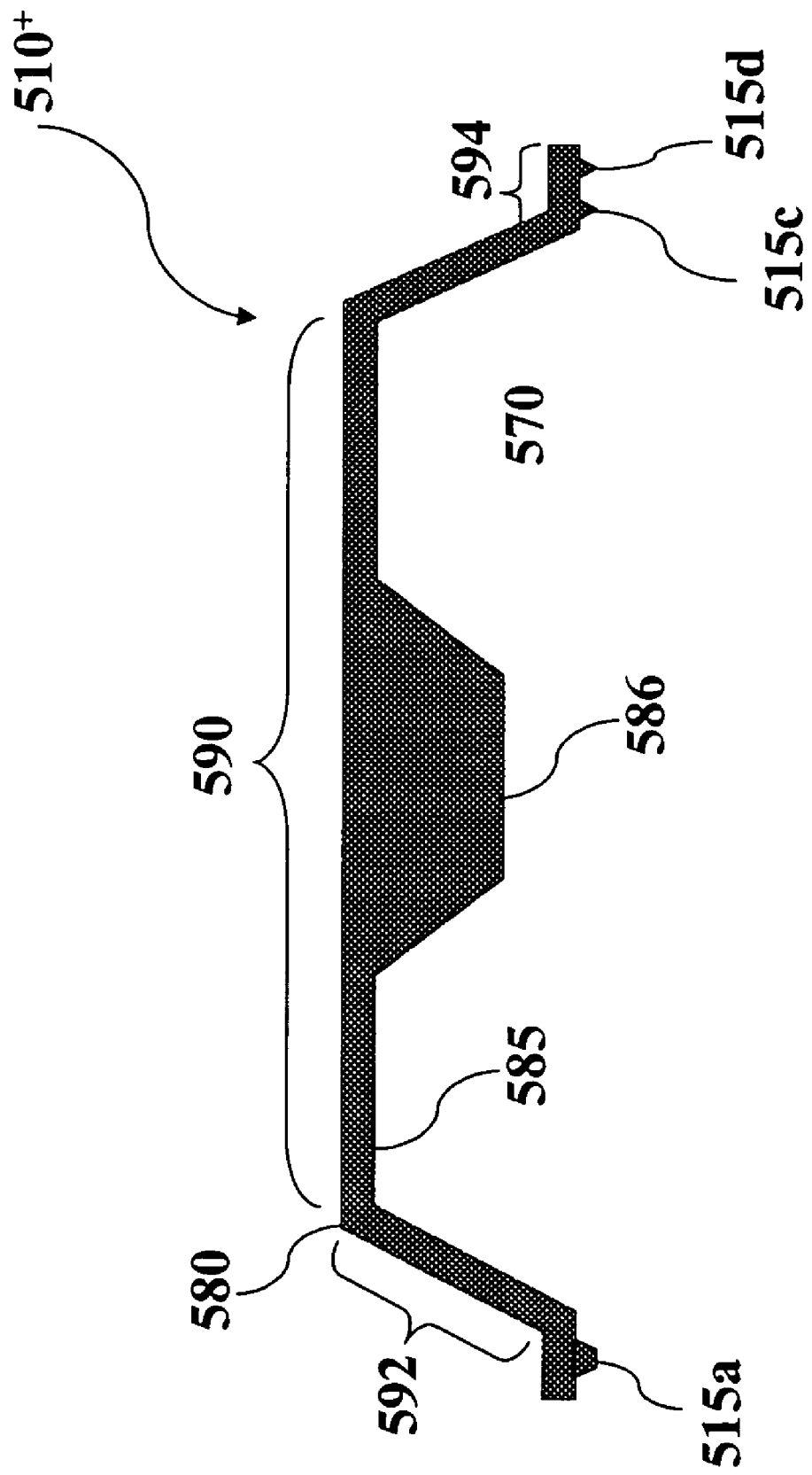

As shown in FIG. 5F, a thermally conductive spacer 586 may be attached to the inside surface (second surface 585) of cap 510$^+$ to reduce the space between the heat spreader cap and the top surface of IC die 150. Spacer 586 may also be attached to the top surface of IC die 150 in the center region away from the peripheral bond pads on IC die 150. The thermally conductive spacer may be of any shape and made of any material including copper, aluminum, metal alloy, silicon etc. Cap 510$^+$ may hang unattached to the DAP, the DAP's extensions (such as the tie bars), or the package leads, when supported by spacer 586 connected to IC die 150.

Example Leadframe Structures

Example embodiments for leadframe structures are described in this section. As mentioned before, no-lead packages may or may not be leadframe-based. Further embodiments will become apparent to persons having skill in the relevant art(s) from the teachings herein. Elements of the leadframe embodiments described herein can be combined in any manner.

FIGS. 6A-6C illustrate various leadframe structures. FIG. 6A shows a leadframe 600 having a DAP 604 with a central portion 605, and a plurality of tie bars 620. Leadframe 600 also includes a plurality of leads 607, and a perimeter support ring 630. DAP central portion 605 may be similar to exposed DAP 140 in FIG. 1A. In FIG. 6A, leadframe 600 is rectangular in shape, having a rectangular perimeter support ring 630 surrounding its periphery. Perimeter support ring 630 includes a first perimeter edge or dam bar 634a, a second perimeter edge or dam bar 634b, a third perimeter edge or dam bar 634c, and a fourth perimeter edge or dam bar 634d, coupled in a rectangular ring. Note, dam bars 634a-634b may be individual bars which may or may not be coupled in a ring. DAP central potion 605 is centered in leadframe 600. DAP central portion 605 may be rectangular in shape. In the embodiment of FIG. 6A, tie-bars 620 extend outward from the four corners of DAP central portion 605.

Leads 607 extend inward perpendicularly from perimeter support ring 630. Leads 607a-h are coupled to tie bars 620. Lead 607a is coupled between edge 634a of leadframe 600 and tie bar 620a. Lead 607b is coupled between edge 634a of leadframe 600 and tie bar 620b. Lead 607c is coupled between edge 634b of leadframe 600 and tie bar 620b. Lead 607d is coupled between edge 634b of leadframe 600 and tie bar 620c. Lead 607e is coupled between edge 634c of leadframe 600 and tie bar 620c. Lead 607f is coupled between edge 634c of leadframe 600 and tie bar 620d. Lead 607g is coupled between edge 634d of leadframe 600 and tie bar 620d. Lead 607h is coupled between edge 634d of leadframe 600 and tie bar 620a. Leads 607 are supported by perimeter support ring 630 in leadframe 600. Leads 607 (except leads 607a-h) may have a portion within perimeter support ring 630 that are generally oriented radially with respect to a center of leadframe 600.

Although FIGS. 6A-6C illustrate a square leadframe, DAP central portion 605, and perimeter support ring 630, other shapes could also be employed (e.g., rectangle, circle, ellipse, curvilinear rectangle, etc). Furthermore, the number of leads 607 is not limited by FIG. 6A, and leadframes may have any number of leads 607.

FIG. 6B shows one embodiment 601 of leadframe 600. Tie-bar 620 may be widened, and may be located at other positions around DAP central portion 605 than what is shown in FIG. 6B. Any number of leads 607 may be fused to a tie-bar, which may further effectively widen the tie-bar. FIG. 6B shows a tie-bar 640 coupled between DAP central portion 605 and first and second leads 607x and 607y. Leadframe 601 may have one or more fused tie bar leads 620, widened fused leads 640, or both. Alternatively, leadframe 601 may have neither widened fused leads 640 nor fused tie-bar leads 620. Furthermore, as shown in FIG. 6B, leadframe 601 may have one or more tie bars 610 that are not coupled to leads 607.

In another embodiment 602 illustrated in FIG. 6C, tie-bars 620a-d have receptacles 615 formed therein. Receptacles 615 correspond to tabs 515 formed in cap 510 (shown in FIG. 5A). As with tabs 515, receptacles 615 can include a rectangular shaped receptacle 615a, a pair 617 of conical shaped receptacles 615b and 615c, a pair 619 of rounded receptacles 615d and 615e, and a rounded receptacle 615f. However, receptacles 615 are not limited to these shapes, combinations of shapes, numbers, locations, or sizes. Receptacles 615 may be indentions (not fully penetrating the leadframe 602) or may be cut-outs (fully penetrating the leadframe 602). Leadframe 602 may have any number of receptacles 615 of any size, shape, and locations. Receptacles 615 on leadframe 602 are configured to couple with tabs 515 on cap 510 providing increased structural strength, as well as enhanced thermal and electrical connection.

Example materials for leadframe include metals, such as copper, copper alloy, (e.g., C194, C151, C7025, or EFTEC 64T), aluminum, aluminum alloys, ferromagnetic materials, other metals and combinations of metals/alloys, or other thermally and electrically conductive materials. Cap 510 and leadframe 600 may be made of the same material or different materials. Leadframe 600 may be any thickness depending on the particular application. For example, leadframe 600 thickness may range from 0.05 mm to 0.5 mm. In another embodiment, leadframe 600 is less than 1.17 mm thick.

In one embodiment, leadframe 600 provides stiffening and/or structural support to an IC package. In another embodiment, leadframe 600 provides heat spreading to an IC package. In another embodiment, leadframe 600 is electrically conductive, and can act as a power or ground plane for an IC package. Leadframe 600 can be configured to provide any combination of stiffening, heat spreading, and electrical conductivity, as required by the particular application.

Example Packages with Leadframe-Cap Encasing Structure

Example embodiments for IC packages are described in this section. Further embodiments will become apparent to persons having skill in the relevant art(s) from the teachings herein. Elements of the IC package embodiments described herein can be combined in any manner.

Figure 7A:
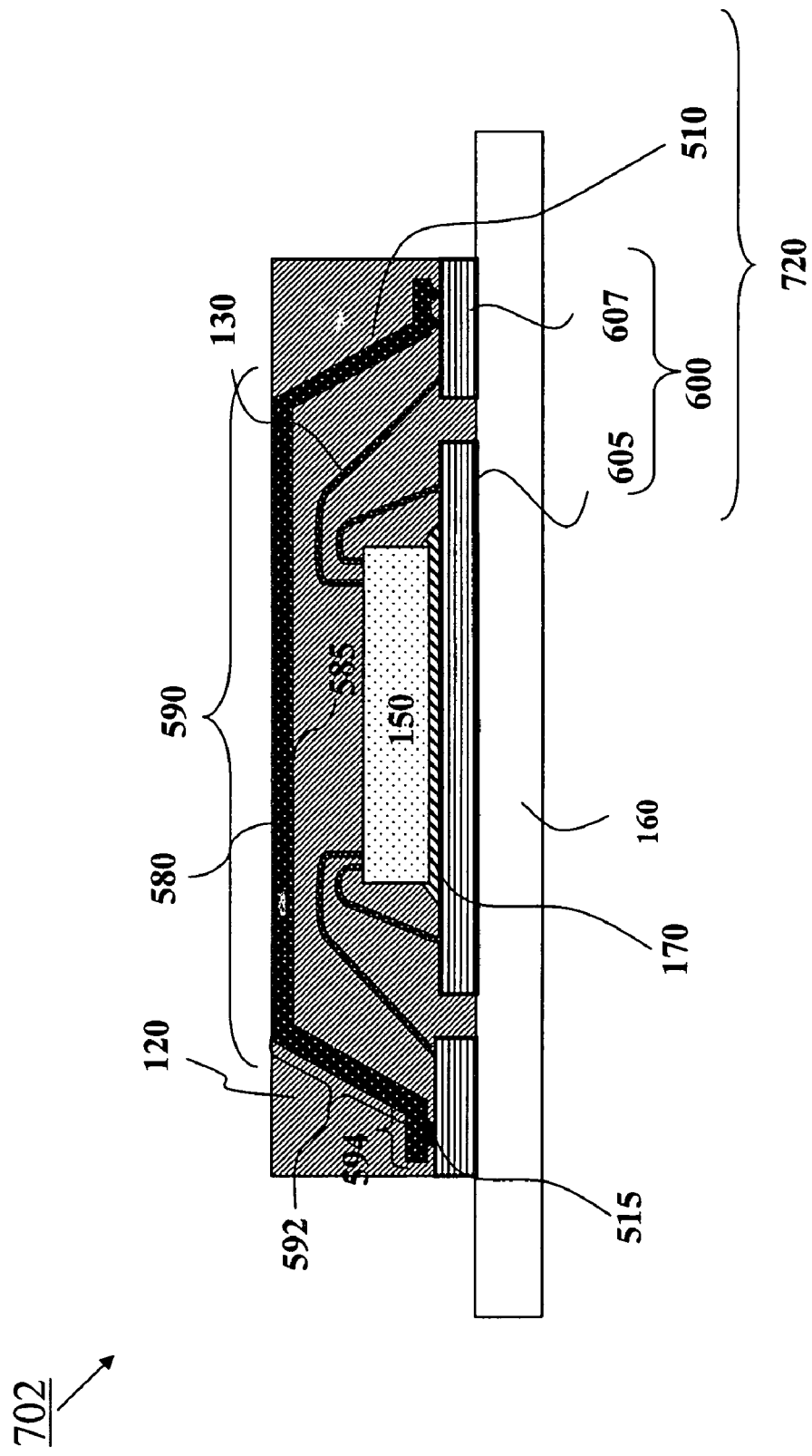
FIGS. 7A-7F show cross sectional views of examples of IC packages with integrated heat spreader caps according to embodiments of the invention.

FIG. 7A shows an example IC package 702 mounted on PCB/PWB 160. Package 702 comprises IC die 150, wirebonds 130, molding material 120, adhesive 170, leadframe 600, and cap 510. Leadframe 600 comprises DAP central portion 605, tie bars 620 (not shown in this view), and leads 607. IC die 150 is mounted on DAP central portion 605 in a die-up configuration. Cap 510 faces die 150. Leadframe 600 and cap 510 form an encasing structure 720 that substantially encloses IC die 150, providing improved structural integrity, EMI shielding, thermal performance, and environmental (e.g., mechanical shock, vibration, caustic, moisture, and radiation) protection. Note that additional IC dies and/or other electrical components may be attached to DAP central portion 605.

Cap 510 and leadframe 600 may be made of copper or copper alloys. The thermal conductivity of copper (roughly 390 W/m·K) is much greater than for typical molding materials 120 (0.2-0.9 W/m·K). Therefore, the heat generated by die 150 is conducted through adhesive 170 to DAP central portion 605 and out of the package through tie bars 620 (not shown in FIG. 7A), package leads 607 and cap 510. Also, since cap 510 and leadframe 600 are electrically connected, they may form a near-equipotential surface, such that encasing structure 720 approximates an ideal "Faraday Cage". In this manner, die 150 is isolated from external EMI. Additionally, external devices are also shielded from EMI generated by die 150. Since copper and copper alloys have a much higher modulus of elasticity (about 125 GPa) compared to a typical cured plastic molding compound used for molding material 120 (about 25 GPa), copper embodiments of the present invention provide improved structural rigidity and environmental protection.

In one embodiment, cap 510 and leadframe 600 are coupled together without the use of tabs and receptacles. In another embodiment, as shown in FIG. 7A, cap 510 has tabs 515 which fit corresponding receptacles (similar to receptacle 615, not shown in this view) on leadframe 600. Tabs 515 and corresponding receptacles on leadframe 600 may facilitate tight lock-in of the cap 510 to leadframe 600. Further, the configuration of tabs 515 and corresponding receptacles on leadframe 600 are such that cap 510 mates correctly with leadframe 600 in only one orientation, which may facilitate assembly. Note that in an alternative embodiment, cap 510 may have receptacles that interlock with tabs of leadframe 600.

Thermally and/or electrically conductive adhesive materials (e.g., epoxy filled with silver flakes or other conductive particles) may be used to improve the coupling between cap 510 and leadframe 600. An adhesive material can be used to attach a tab 515 and a corresponding receptacle on leadframe 600, when they are present. Alternatively, the adhesive material may be used at areas where cap 510 contacts leadframe 600. Tin-lead or silver soldering materials can be used to join cap 510 with leadframe 600 through processes such as solder plating and reflow or screen printing of solder paste and reflow. In another embodiment, welding or other metal joining methods can be used to attach cap 510 to leadframe 600.

Leadframe 600 may be plated with a conductive material to improve the thermal and electrical connection. In one embodiment, cap 510 may be mounted to DAP central portion 605 of leadframe 600. In another embodiment, cap 510 is mounted to tie-bars 620 coupled between DAP central portion 605 and the package leads 607. In yet another embodiment, as shown in FIG. 7A, cap 510 may be mounted to one or more leads 607. Cap 510 can be mounted to any combination of DAP central portion 605, tie bars 620, and leads 607. Further, portions of the bottom surface, or all of the bottom surface of rim 594 of cap 510 may be coated with a layer of dielectric material (e.g. solder mask, dielectric film etc.) to prevent electrical shorting with one or more of leads 607. In one embodiment, cap 510 may not be in physical contact with leadframe 600. In yet another embodiment, the contact surface between cap 510 and leadframe 600 may be substantially flat and smooth when welding or other metal joining method is used to couple cap 510 to leadframe 600.

Leads 607 of leadframe 600 are shaped to be coupled to a PCB/PWB 160. For example, an outer portion of leads 607 extending from package 702 may be bent downward to allow leads 607 to contact a PCB/PWB 160.

Further Example Integrated Circuit Packages

Integrating a molding material, such as glob top or plastic molding compound, with an encasing structure may enhance the structural rigidity and planarity of the IC package. For example, the combination of the molding material and the encasing structure may reduce IC die cracking and delamination. Integrating the molding material with the encasing structure also enhances environmental protection. For example, the integrated package can provide protection against mechanical stress, impact, vibration, chemical corrosives, moistures, heat exposure, radiation, etc.

Additionally, attaching the IC die directly to the encasing structure adds mass to the die support, and helps reduce microphonics. The metal traces of the IC die have electrical resistance, capacitance, and inductance. After IC packaging and assembly of the package on the PCB/PWB, the IC die is under mechanical stress. Vibration, mechanical shock, or sudden change of temperature can cause a change of stress distribution within the IC die, and thus alter a capacitance and resistance such that a voltage vibration or drift is produced. This phenomenon is called microphonics. Attachment of the semiconductor die directly to the encasing structure increases the mass and helps dampening these mechanical shocks and vibrations, thus reducing microphonics.

Typical molding materials, such as plastic molding compound, have low thermal conductivity (e.g., about 0.2 to 0.9 W/m·K) and therefore create a bottleneck for heat dissipation in conventional IC packages. The encasing structure may eliminate this bottleneck by providing a thermally conductive path from the bottom surface of the IC die to the outer surfaces of the package. Additionally, the encasing structure is made with materials that have high thermal conductivity (e.g., approximately 390 W/m·K for copper) and therefore promote heat dissipation.

An encasing structure formed by cap 510 and leadframe 600 may be incorporated into IC packages of many different configurations. FIGS. 7A-7F illustrate some example embodiments of the present invention, each showing an encasing structure. For example, cap 510 is coupled with leadframe 600 to form encasing structure 720 in FIG. 7A. Encasing structure 720 substantially encloses IC die 150. In the packages shown in FIGS. 7A-7F, at least one wire bond 130 couples at least one bond pad (not shown) on a surface of IC die 150 to leadframe 600. The IC bond pad connected to leadframe 600 may be a ground pad.

As shown in FIG. 7A, cap 510 has a top surface 590 that is exposed through the molding material 120 encapsulating package 702. Thus, molding material 120 does not cover the entirety of first surface 580 (outer surface of cap 510). Second surface 585 (inner surface of cap 510) is covered by molding material 120.

Figure 7B:
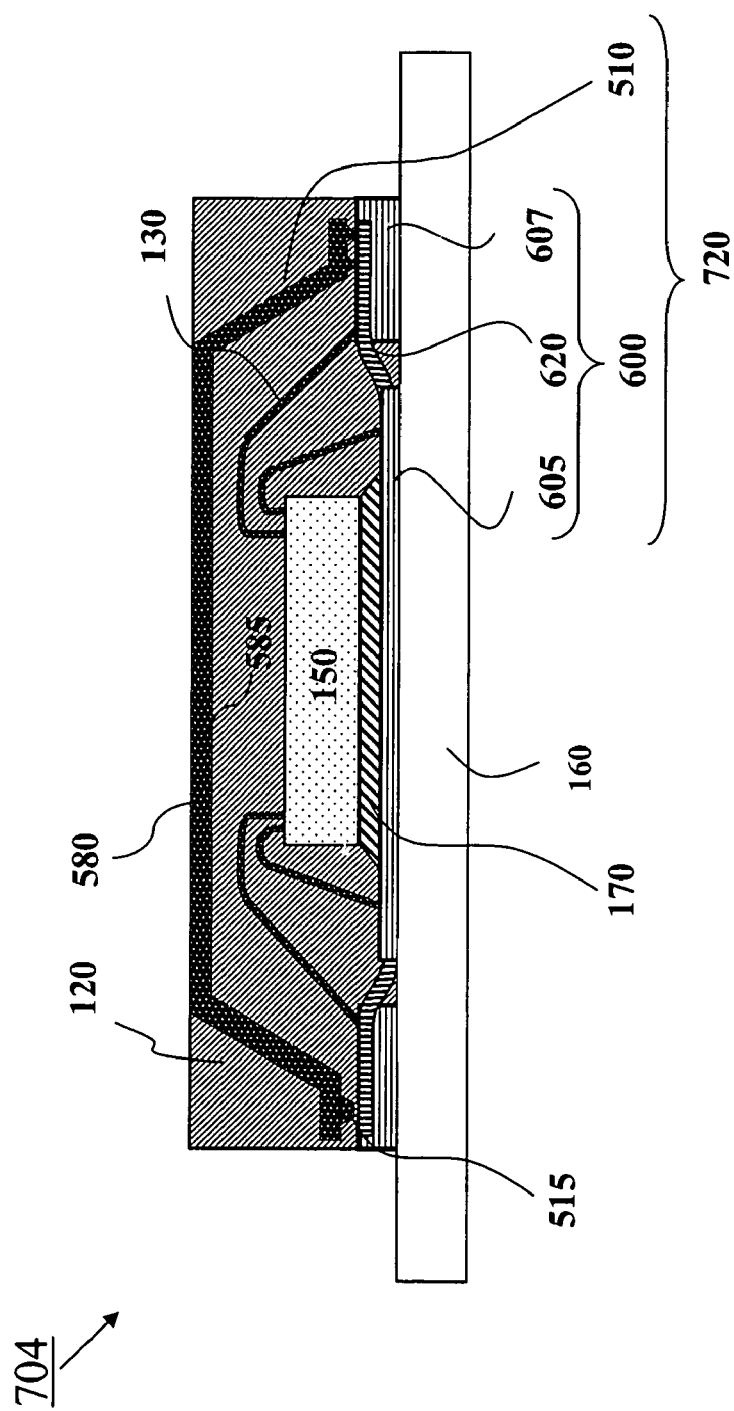
Figure 7C:
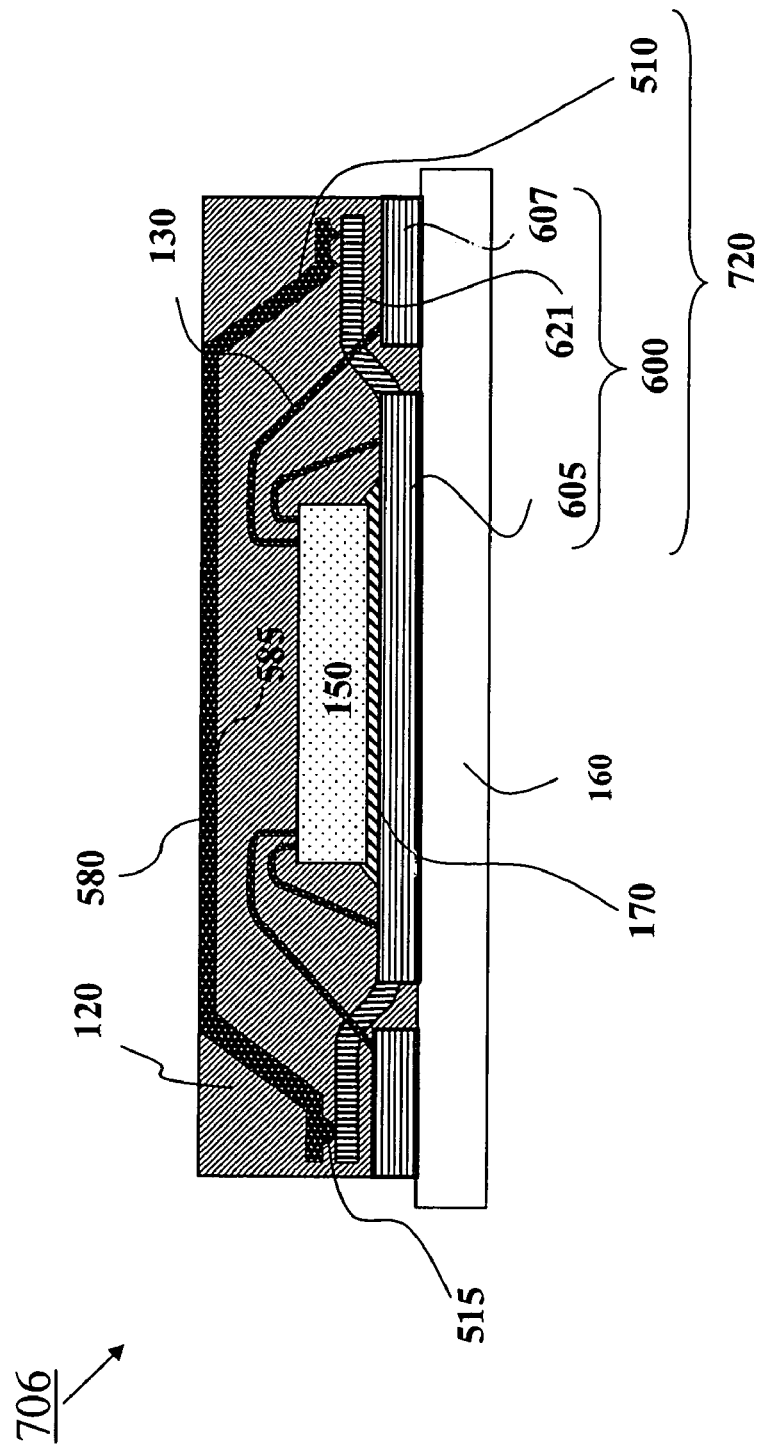

Package 704 in FIG. 7B and package 706 in FIG. 7C are similar to package 702 in FIG. 7A, but showing the relative position of tie bars 620 (not shown in FIG. 7A) with respect to leads 607 in leadframe 600. FIG. 7B shows that leadframe 600 may have tie bars 620 on the same plane as the leads of leads 607. Tie bars may also be in a different plane with respect to leads. As shown in FIG. 7C, tie bars 621 are above leads 607.

Figure 7D:
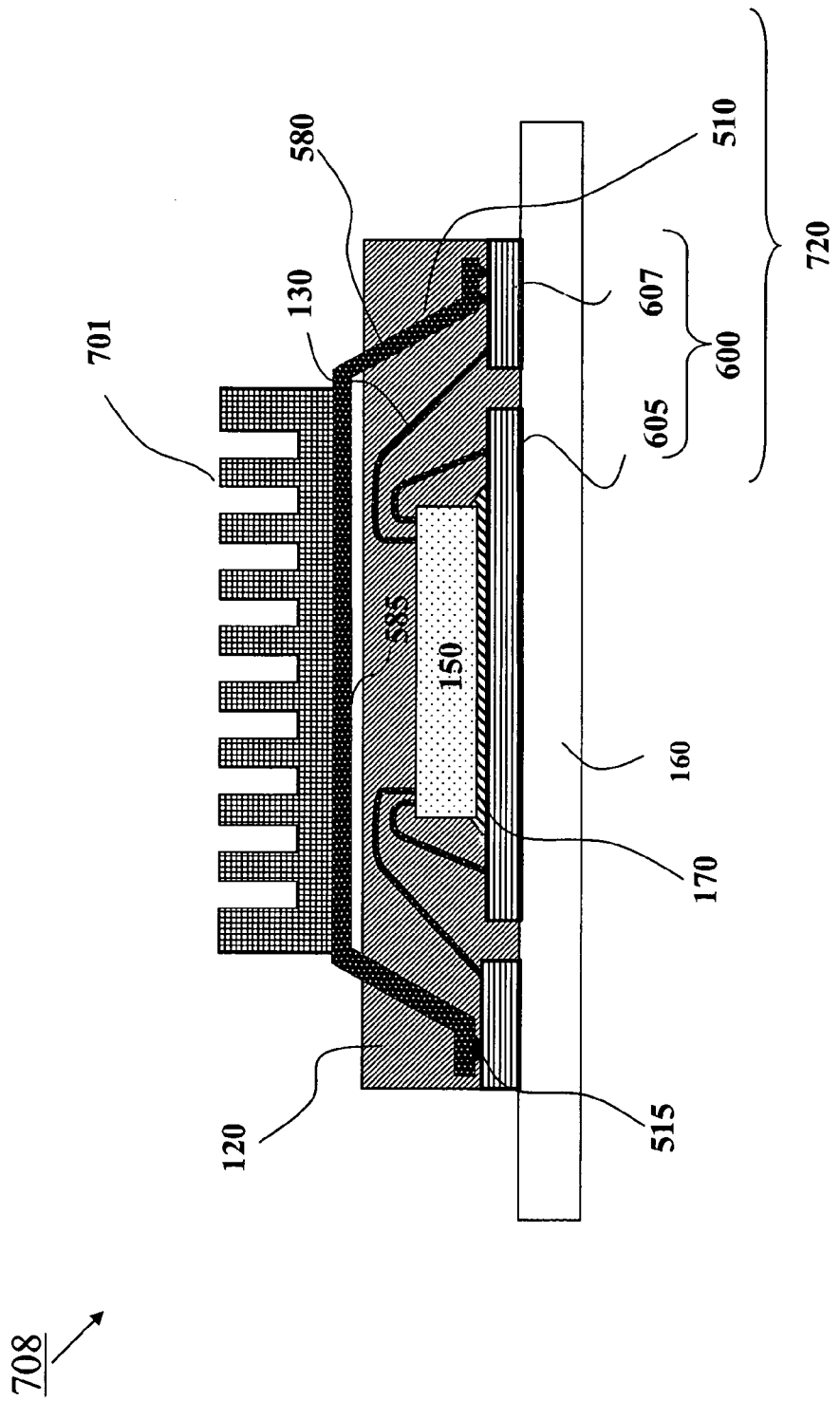

FIG. 7D shows an IC package 708 similar to package 702 in FIG. 7A. However, in IC package 708, cap 510 is configured to mount an external heat sink 701. Leadframe 600 and cap 510 provide a path for heat to be conducted from die 150 to heat sink 701, and thus out of package 708. In package 708, first and second surfaces 580 and 585 of cap 510 are not fully covered by molding material 120. In IC package 708, cap 510 is added to the package after molding material 120 has been applied during the assembly process.

Figure 7E:
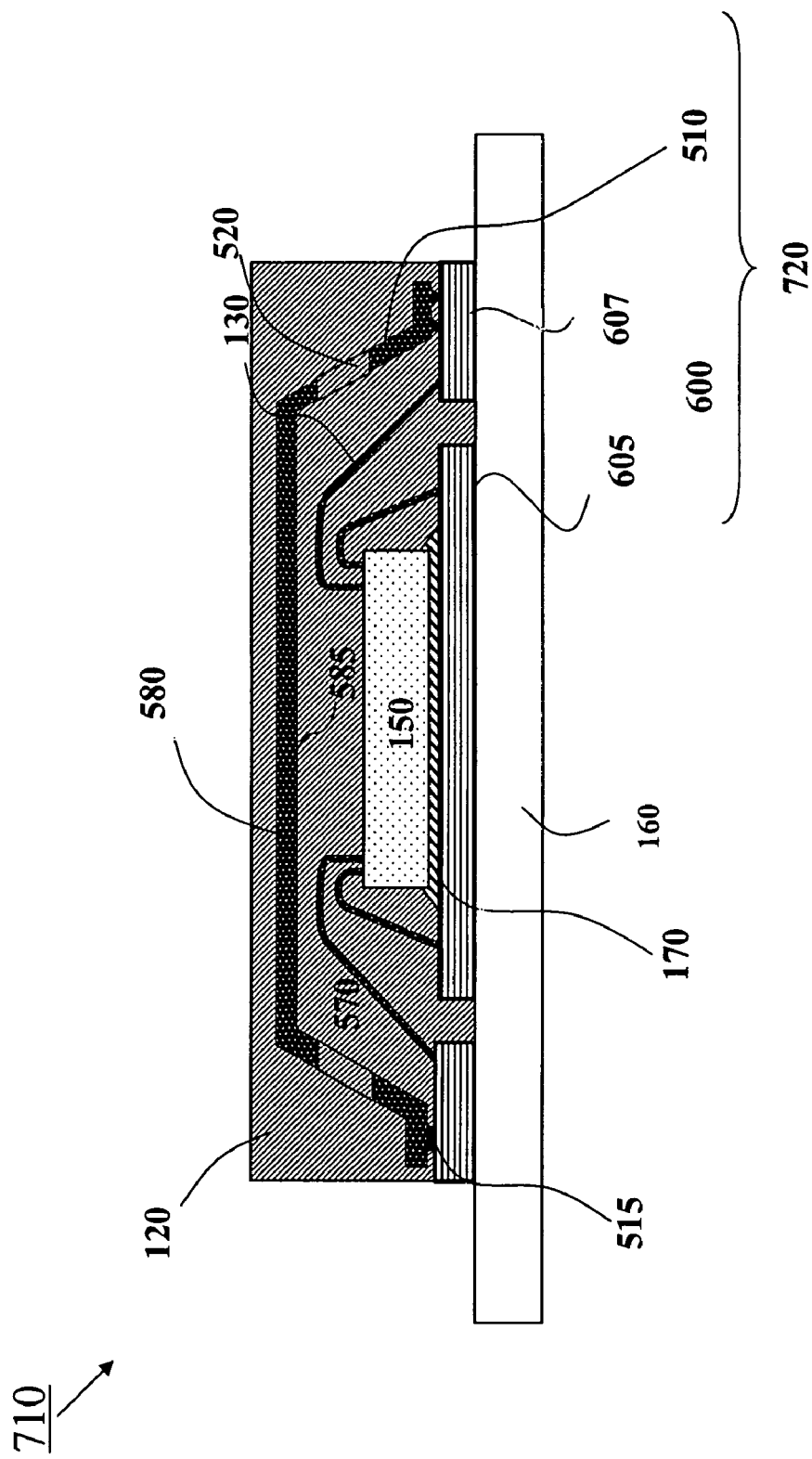

A package 710, similar to package 702, may include a cap 511 instead of cap 510 with no openings. Cap 511 has one or more openings (e.g. slots 520), as shown in FIG. 7E. These openings may act as mold gate openings, allowing molding material 120 to flow or be injected into cavity 570. In package 710, both first surface 580 and second surface 585 of cap 511 are covered by molding material 120.

Figure 7F:
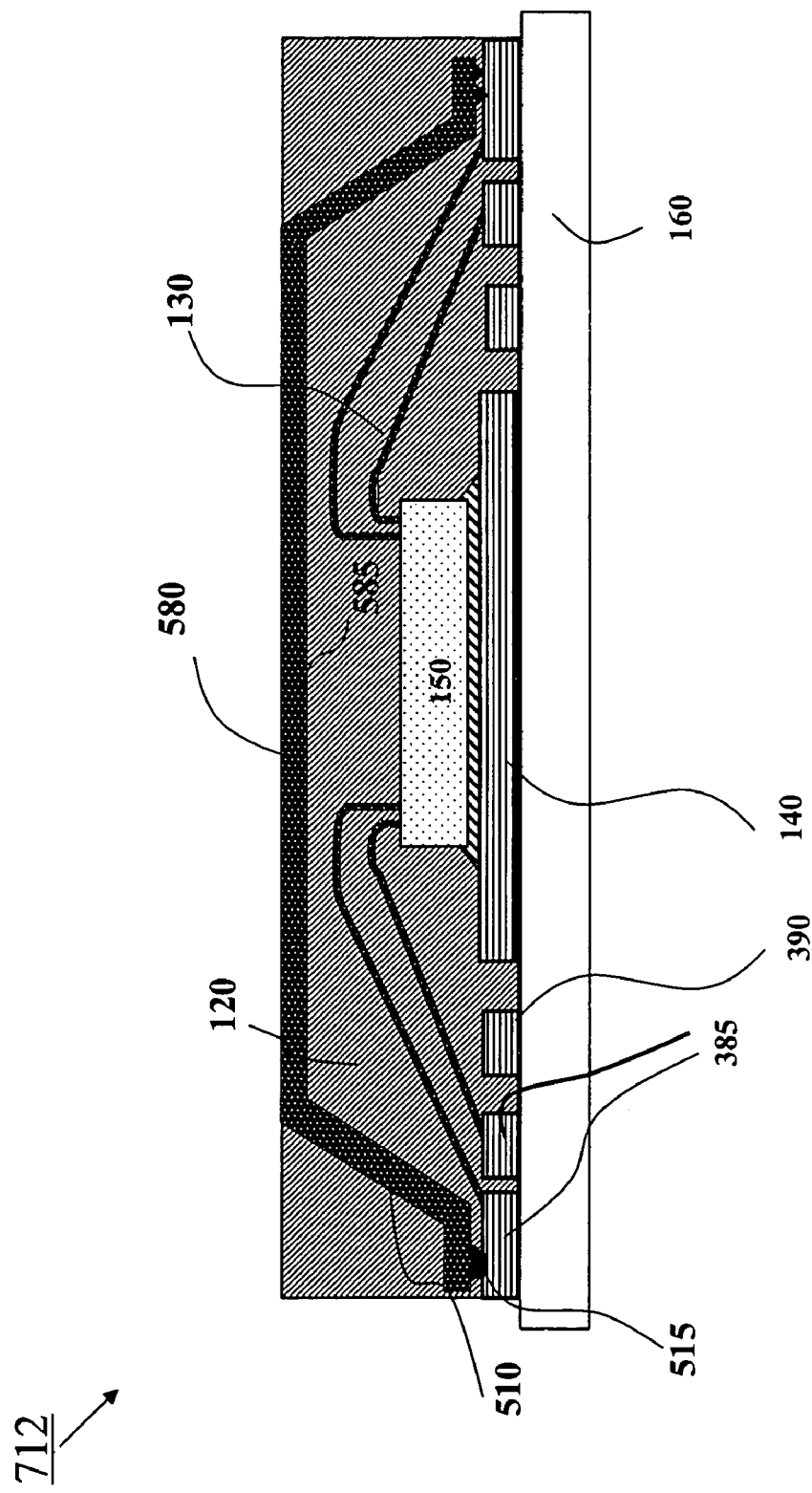

FIG. 7F shows a package 712, which is the equivalent TAPP-version of package 702 shown in FIG. 7A. As characteristic of TAPP-type packages, leads 385 are arranged around DAP 140 in an array containing multiple rows rather than a single peripheral row. Wire bonds 130 are formed to connect bond pads on IC 150 to leads 385. Cap 510 may be attached to the outermost row of leads 385 with tabs 515. One or more interposer rings 390 may be present surrounding DAP 140. Cap 510 and DAP 140 may be part of an encasing structure that encloses IC die 150. In one embodiment, DAP 140, interposer ring 390, and leads 385 may be coupled together as a leadframe. Variation in package structure discussed with reference to FIGS. 7B-7E are applicable to TAPP package 712 as well.

Embodiments of the present invention are not restricted to die-up configurations. A package may be in a die-down configuration, according to an example embodiment of the present invention. In comparison to package 702 in FIG. 7A, surface 580 of cap 510 may be exposed on the bottom side of a package. The features reflected in the embodiments illustrated in FIGS. 7A-7F are applicable to the die-down configurations as well. In a die-down package, exposed surface 580 of cap 510 may be coupled to PCB/PWB 160 with electrically and/or thermally conductive adhesive or solder. Thus, heat conducted from IC die 150 through leadframe 600 and cap 510 may be conducted out of the package into PCB/PWB 160. Surface 580 of cap 510 may be electrically connected to a power pad or pads on PCB/PWB 160 to improve EMI shielding and power delivery from the package. Alternatively, surface 580 of cap 510 may be electrically connected to ground pad or pads on PCB/PWB 160 to improve EMI shielding and current return from the package. A thermal and/or electrical connector, such as a heat slug may be attached to the outer surface 580 of cap 510 in a die-down configuration, wherein the heat slug couples the package to the PCB/PWB.

Example Manufacturing Processes

Figure 8:
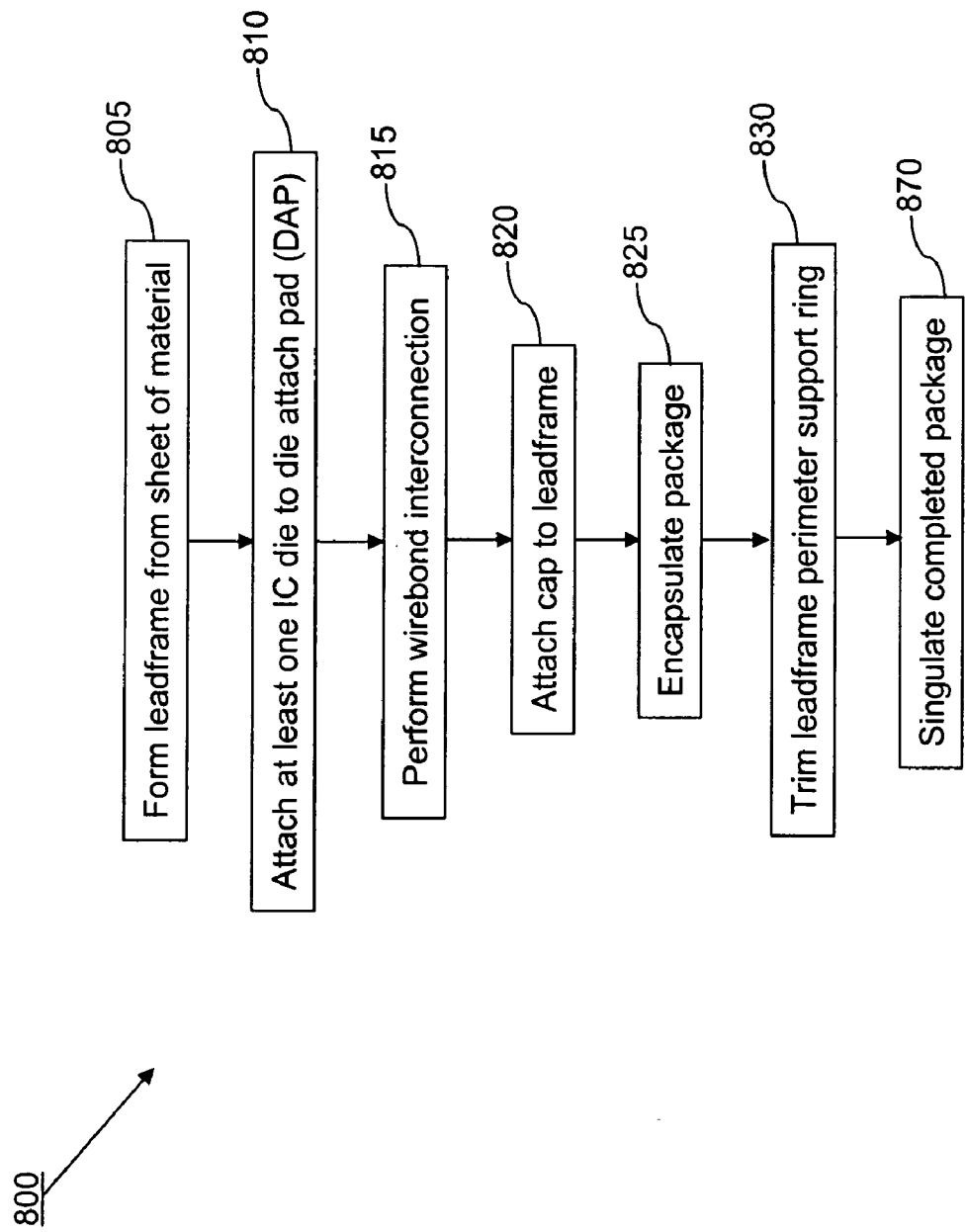
FIG. 8 shows a flowchart illustrating example steps for assembling leadframe IC packages, according to embodiments of the invention.
Figure 9A:
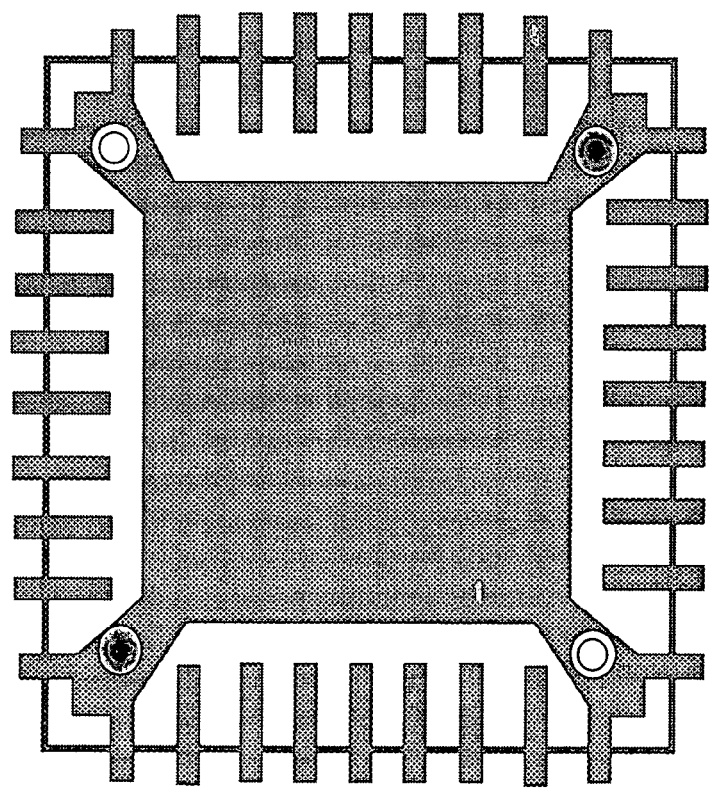
FIGS. 9A-9D show plan views of examples of leadframe IC packages undergoing assembly, according to embodiments of the invention.

FIG. 8 shows a flowchart 800 illustrating example steps to assemble leadframe package 702 shown in FIG. 7A, according to one embodiment of the present invention. As would be understood by one skilled in the art, adaptation of these assembly processes could be used to assemble any embodiments, including those illustrated in FIGS. 7A-7F. The steps in FIG. 8 do not necessarily have to occur in the order shown, as will be apparent to persons skilled in the relevant art(s) based on the teachings herein. Other operational and structural embodiments will be apparent to persons skilled in the relevant art(s) based on the following discussion. These steps are described in detail below with respect to FIGS. 9A-9G, for illustrative purposes. FIGS. 9A-9D illustrate top views and FIGS. 9E-9G show side views of embodiments of the invention at different stages of assembly.

Flowchart 800 begins with step 805. In step 805, a leadframe is formed from a sheet of material. Example leadframe material and features are discussed elsewhere herein.

In step 810, at least one IC die is attached to a DAP of a leadframe.

In step 815, wire bond interconnection is performed.

In step 820, a cap is attached to the leadframe.

In step 825, the package is encapsulated.

In step 830, the leadframe perimeter support ring is trimmed.

In step 870, individual packages are singulated, i.e. cut out from the leadframe panel.

FIG. 9A illustrates a view of a single leadframe 600. Note that leadframe 600 in FIG. 9A-9G may have features described in leadframe embodiments 601 and 602.

Figure 9B:
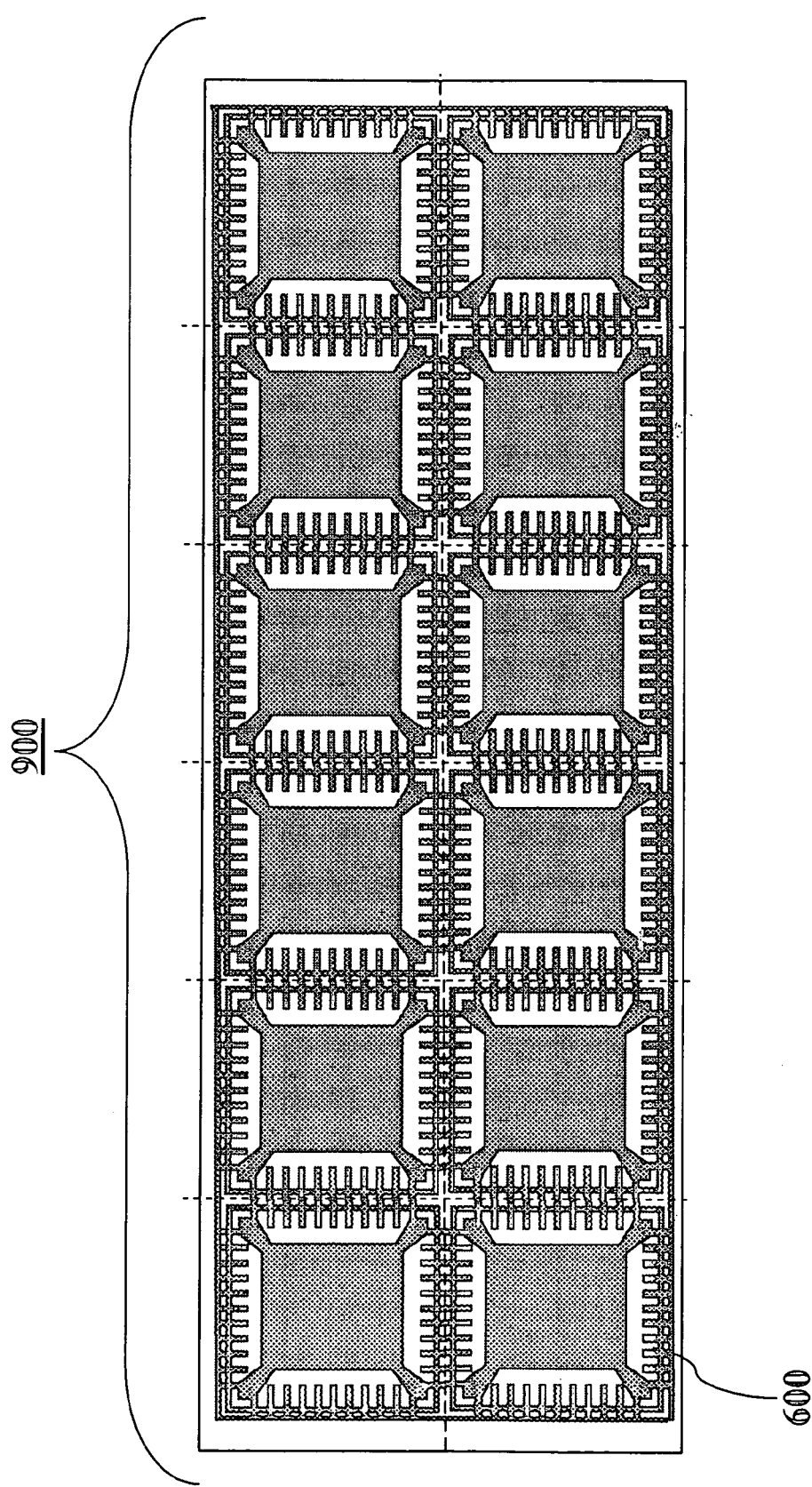

FIG. 9B illustrates an example leadframe panel 900 that contains an array of leadframes 600. Leadframes 600 in leadframe panel 900 are manufactured by an etching or stamping process, for example.

Figure 9C:
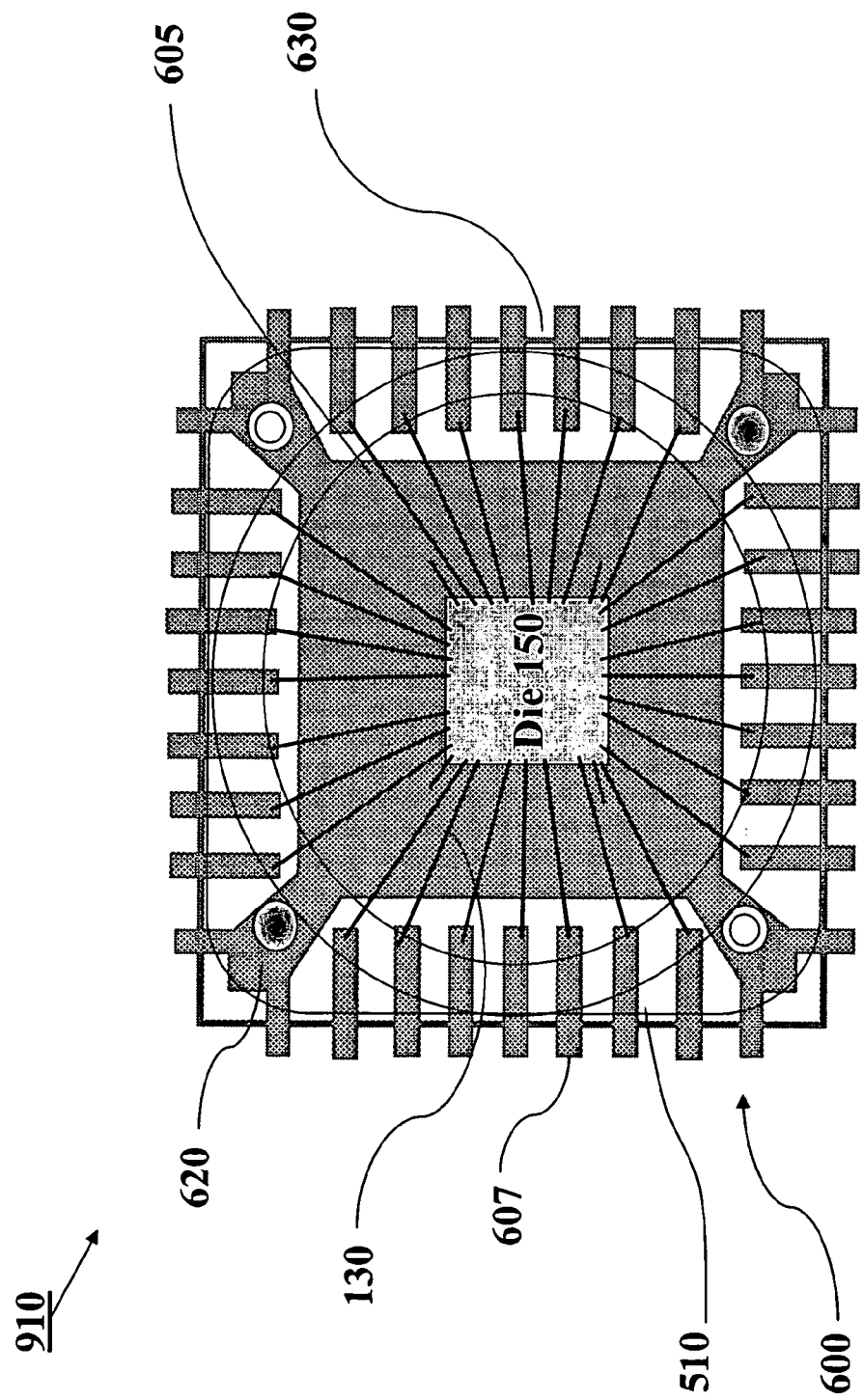

FIG. 9C shows a partially assembled package 910. At least one IC die 150 is attached to DAP central portion 605. Wirebonds 130 are used to attach pads of IC die 150 to leadframe 600, providing electrical connections from IC die 150 to leads 607, tie bars 620, and/or DAP central portion 605. A cap 510 is attached to leadframe 600. Electrically and/or thermally conductive adhesive materials may be used to improve coupling between cap 510 and leadframe 600. Cap 510 and leadframe 600 are joined to form an encasing structure which substantially encloses IC die 150. Cavity size of cap 510 should be large enough to avoid cap 510 touching the bond wires.

Figure 9D:
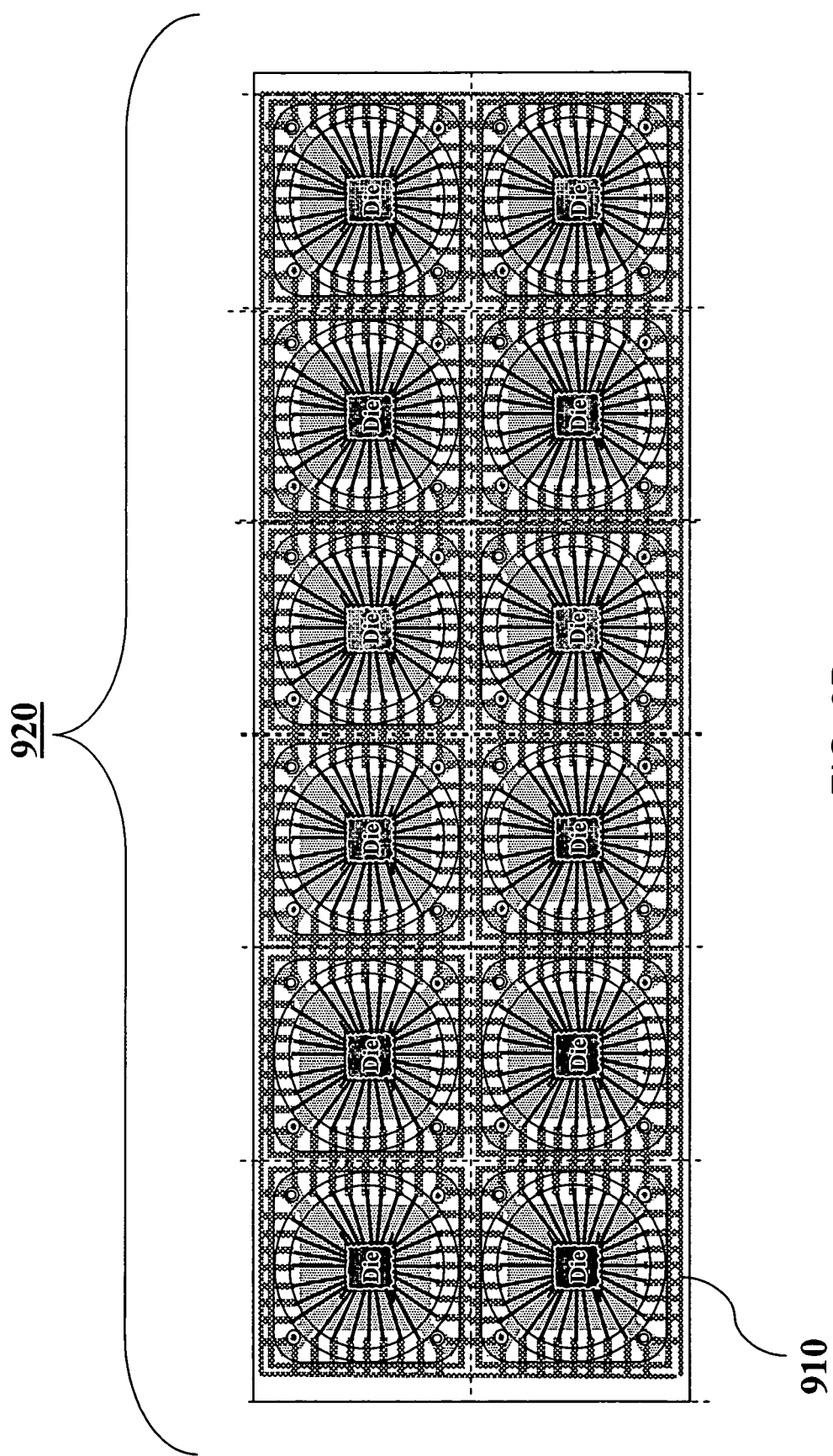

FIG. 9D illustrates a partially assembled panel 920 of partially assembled packages 910.

FIG. 9E shows the side view of a partially assembled package after step 815 of flowchart 800 is finished.

FIG. 9F shows the side view of partially assembled panel 920 of FIG. 9D, after step 820 of flowchart 800.

FIG. 9G shows a side view of an encapsulated panel 930 of leadframe packages, after step 825 of flowchart 800. In step 825, the package is encapsulated. In this step, a molding material 120 encapsulates partially assembled packages 910. Packages 910 may be clamped in a mold chase to mold or shape a molding compound being used to encapsulate the package. As described elsewhere herein, an outer peripheral dimension of a cap 510 is smaller than a peripheral dimension of perimeter support ring 630. This prevents the molding material from bleeding through gaps between leads 607. Support ring 630 may also provide sealing between the clamped mold chase during the transfer molding process.

Leadframe perimeter support ring 630 is trimmed in step 830. Leads 607 are ready to be formed into contact pins for board mount and a leadframe package is completely assembled. For example, the outer portion of leads 607 extending from the package may be bent downward to allow them to contact a PCB/PWB.

In step 870, individual packages, such as package 702 of FIG. 7A, are cut out from the leadframe panel.

Figure 10:
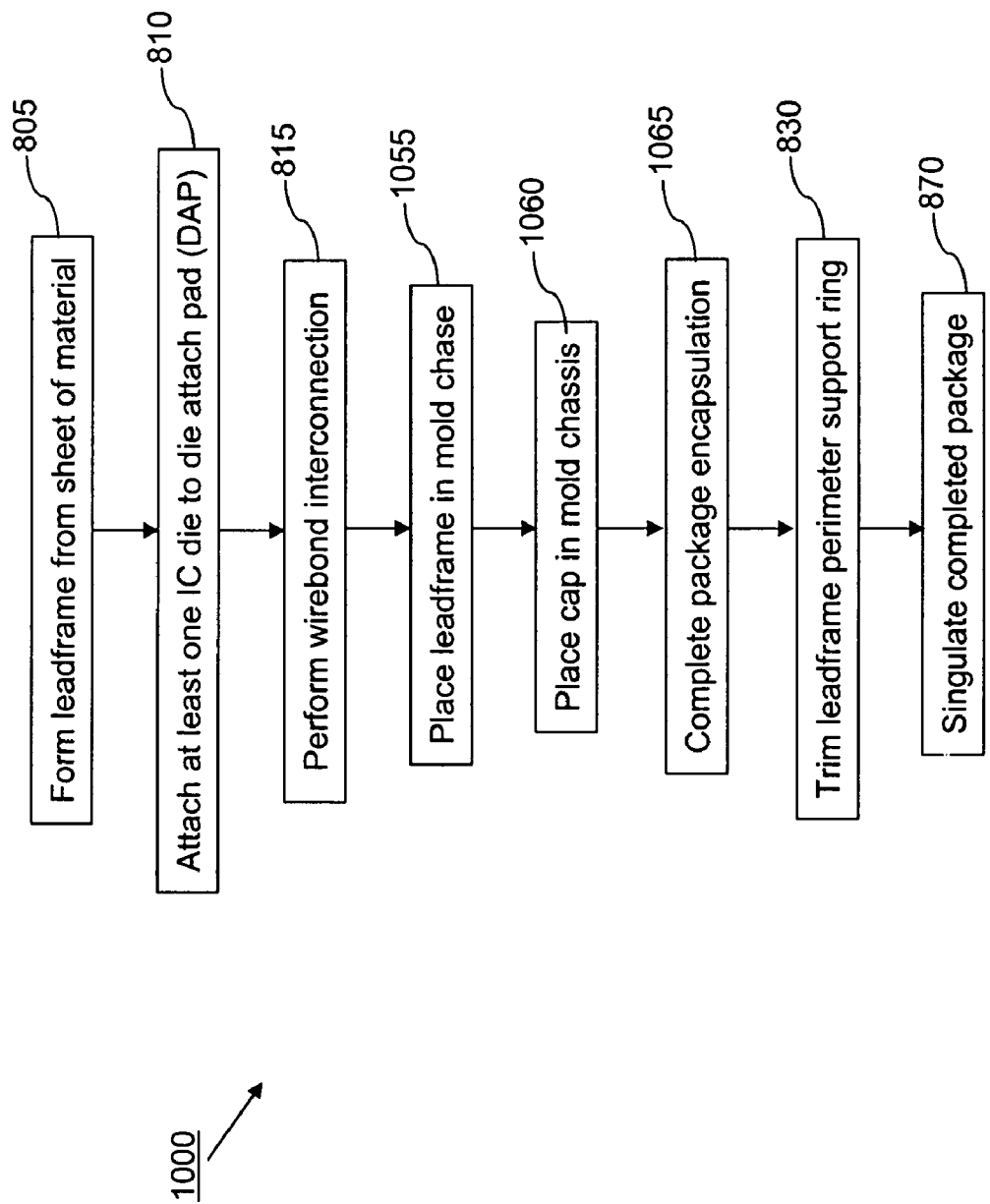
FIG. 10 shows a flowchart illustrating example steps for assembling leadframe IC packages in an alternative process different from FIG. 8.

Flowchart 1000 shown in FIG. 10 shows example steps for forming an integrated circuit package, according to an alternative embodiment of the present invention. Steps 805, 810, and 815 are the same as shown in flowchart 800 in FIG. 8. However, step 1055 (placing a leadframe in the mold chase), step 1060 (placing a cap in the mold chase), and step 1070 (completing encapsulation) may be different from flowchart 800.

According to the assembly process shown in flowchart 1000, instead of coupling a cap 510 to a leadframe 600 outside of the mold chase, a leadframe 600 and a cap 510 are put into the mold chase in steps 1055 and 1060. Leadframe 600 is clamped between upper and lower mold chase and contact between the cap placed in mold chase and the leadframe tie-bar or fused lead is made by clamping the cap against the leadframe. To enhance electrical contact between the cap and the leadframe, electrically conductive adhesives such as silver flake/particle loaded epoxies can be pre-deposited on the contact pads of leadframe before clamping the components on the mold chase.

In step 1065, package encapsulation is completed.

The subsequent assembly steps in flowchart 1000 are similar to flowchart 800.

Leadframe perimeter support ring 630 is trimmed in step 830.

In step 870, individual packages are singulated, i.e. cut out from the leadframe panel.

Figures 11A, 11C:
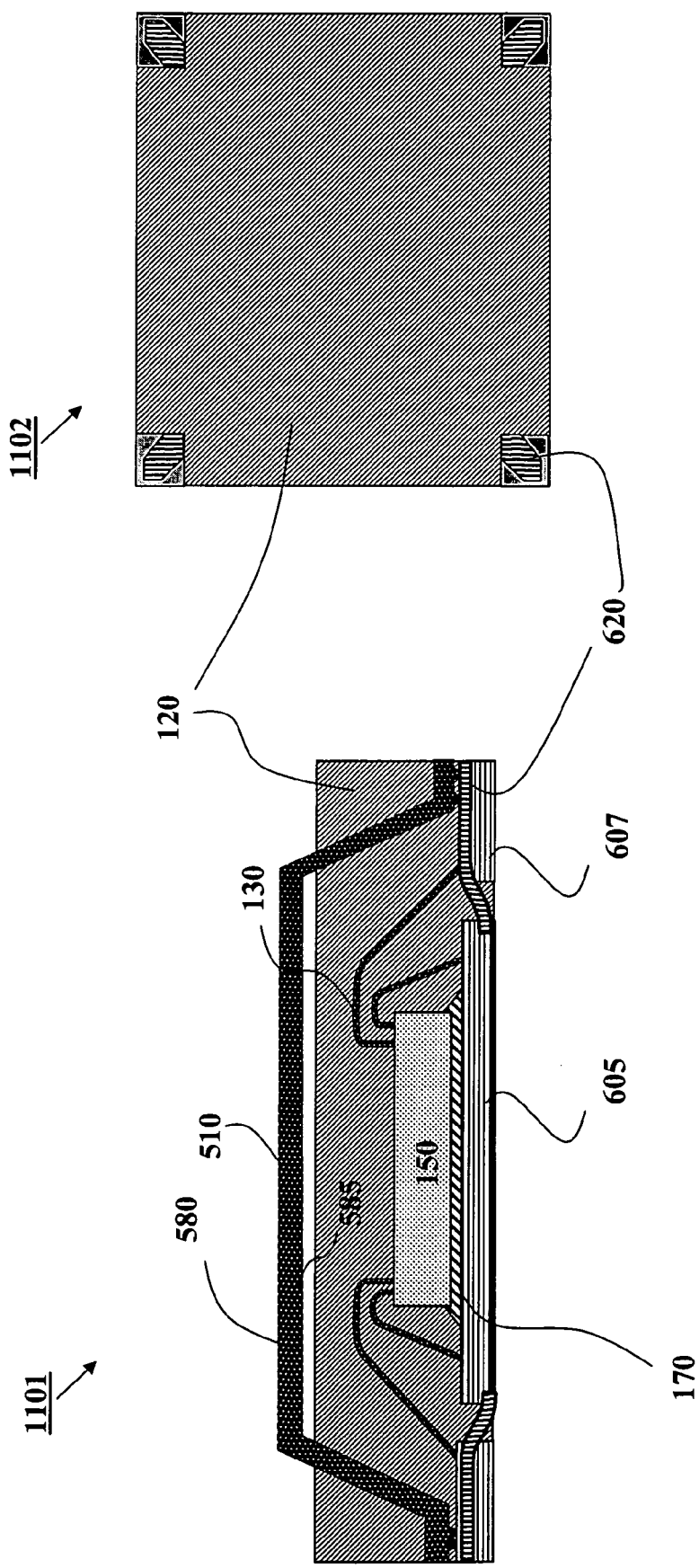
FIGS. 11A-11C illustrate an example method for attaching a cap to a leadframe after encapsulation.
Figure 11B:
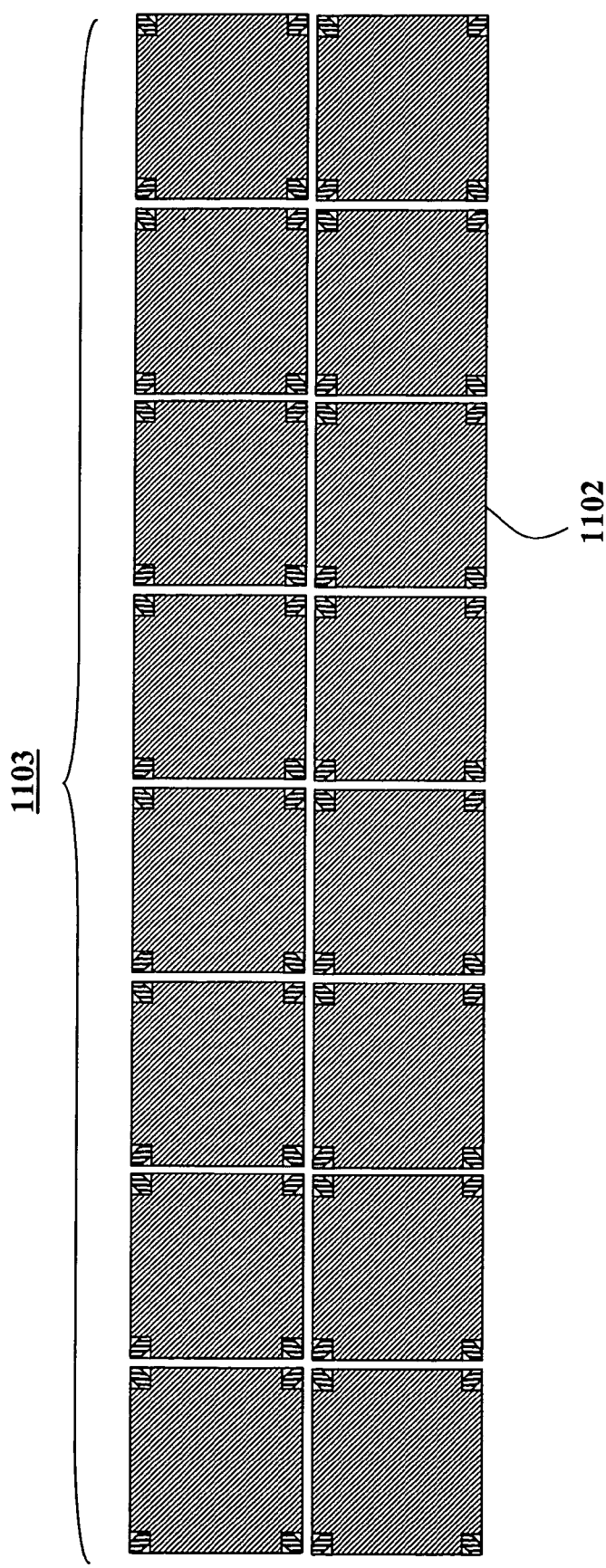

FIGS. 11A-11C illustrate how a package 1101 (similar to package 708 in FIG. 7D, but without the external heat sink 701) can be assembled following another assembly process different from the ones discussed in flowcharts 800 and 1000. In this process, cap 510 is attached to DAP central portion 605 after the molding step. FIG. 11A is the side view of a fully assembled singulated package 1101. FIG. 11B shows unsingulated leadframes after they are molded simultaneously to form molded strips 1103. After molding, portions of the DAP from each package, for example, tie bars at the four corners, are exposed. FIG. 11C shows the top view of a singulated leadframe package 1102 after the molding process, before cap 510 is attached. FIG. 11C shows the exposed tie bars of a singulated package 1102. Cap 510 is coupled to the exposed tie bars to form the encasing structure. Cap surfaces 580 and 585 are both not covered by molding material 120.

Note that a similar assembly processes can be utilized when, instead of conventional leadframe, TAPP-type leadframes including ground/power interposer rings coupled to tie bars or fused leads are used.

Example Advantages of the Embodiments

The die attach pad with the integrated thermally and electrically conductive cap attached to it offers a variety of advantages, in addition to the advantages discussed previously. These include providing easy access to the equipotential plane of the package (including ground potential) when the cap is connected to the corresponding bond pad on the IC or the PCB; reducing moisture migration to the IC surface in non-hermetic plastic packages; and providing flexibility of adding or removing the integrated cap without requiring to change leadframe or TAPP-type package design.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An integrated circuit (IC) device package, comprising:
   an IC die having bond pads;
   an encasing structure that substantially encloses the IC die, comprising:
   a leadframe, including:
   a die attach pad having a substantially planar central portion with opposing first and second surfaces, wherein the first surface of the central portion of the die attach pad has the IC die mounted on,
   a plurality of tie bars, each tie bar being coupled to the die attach pad, wherein a. tie bar of the plurality of tie bars comprises at least one receptacle, and
   a plurality of leads emanating outward from the IC die, each lead being coupled to a bond pad of the bond pads, wherein a tie bar of the plurality of tie bars is coupled to at least two leads of the plurality of leads; and
   a cap having a cavity and a planar rim surrounding the cavity, such that the cavity faces the IC die, wherein the cap is coupled to the leadframe, wherein the cap comprises at least one tab protruding from the planar rim, and wherein the at least one tab mates with the at least one receptacle; and
   a molding material that substantially encapsulates the IC die and at least partially fills the cavity.

2. The package of claim 1, wherein the package is in a die-up or die-down configuration.

3. The package of claim 1, wherein the encasing structure is constructed and arranged to spread heat from the IC die during operation of the IC die.

4. The package of claim 1, wherein the encasing structure is constructed and arranged to shield electromagnetic interference (EMI) emanating from the IC die and EMI radiating toward the IC die from outside the package.

5. The package of claim 1, wherein one or more perimeter support rings or dam bars structurally connect the leads.

6. The package of claim 1, wherein the leads are arranged in an array with more than one row.

7. The package of claim 6, further comprising one or more interposer conducting rings coupled to the tie bars surrounding the die attach pad.

8. The package of claim 7, wherein one or more perimeter support rings or dam bars structurally connect the leads.

9. The package of claim 1, wherein the rim of the cap includes a substantially planar lip portion extending outwards from the cavity that encloses the IC die.

10. The package of claim 1, wherein the cap is in electrical and thermal contact with at least one lead.

11. The package of claim 1, wherein the cap is electrically isolated from any of the plurality of leads.

12. The package of claim 1, wherein at least a portion of the planar rim of the cap is coated with a dielectric material.

13. The package of claim 1, wherein at least a portion of the die attach pad coupled to the cap is coated with a dielectric material.

14. An integrated circuit (IC) device package, comprising:
   an IC die having bond pads;
   an encasing structure that substantially encloses the IC die, comprising:
   a die attach pad having a substantially planar central portion with opposing first and second surfaces, and a plurality of tie bars coupled to and extending from the central portion, wherein the first surface of the central portion of the die attach pad has the IC die mounted on thereon, and
   a cap having a cavity and a planar rim surrounding the cavity, such that the cavity faces the IC die when the rim is attached to the die attach pad, thereby enclosing the IC die;
   a plurality of leads having lead fingers for wire bonding arranged in at least one peripheral row surrounding the die attach pad; and
   a molding material that substantially encapsulates the IC die and at least partially fills the cavity, wherein at least one of the plurality of tie bars is wider relative to others of the plurality of tie bars.

15. The package of claim 1, wherein at least one of the plurality of leads is wider relative to others of the plurality of leads.

16. An integrated circuit (IC) device package, comprising:
   an IC die having bond pads;

an encasing structure that substantially encloses the IC die, comprising:
a die attach pad having a substantially planar central portion with opposing first and second surfaces, and a plurality of tie bars coupled to and extending from the central portion, wherein the first surface of the central portion of the die attach pad has the IC die mounted on thereon, and
a cap having a cavity and a planar rim surrounding the cavity, such that the cavity faces the IC die when the rim is attached to the die attach pad, thereby enclosing the IC die;
a plurality of leads having lead fingers for wire bonding arranged in at least one peripheral row surrounding the die attach pad; and
a molding material that substantially encapsulates the IC die and at least partially fills the cavity, wherein the cap is in electrical and thermal contact with at least one tie bar.

17. The package of claim 1, wherein the plurality of tie bars and the plurality of leads are positioned in a first plane.

18. The package of claim 1, wherein the plurality of tie bars are positioned in a first plane and the plurality of leads are positioned in a second plane.

19. The package of claim 1, wherein the planar rim portion of the cap is coupled to the die attach pad by a thermally and electrically conductive adhesive.

20. The package of claim 1, further comprising:
at least one electrically conductive plated area patterned on the die attach pad such that the plated area is in contact with the planar rim portion of the cap.

21. The package of claim 1, wherein the cap is electrically insulated from the die attach pad.

22. The package of claim 1, wherein the cap is coupled to a ground potential.

23. An integrated circuit (IC) device package, comprising:
an IC die having bond pads;
an encasing structure that substantially encloses the IC die, comprising:
a die attach pad having a substantially planar central portion with opposing first and second surfaces, and a plurality of tie bars coupled to and extending from the central portion, wherein the first surface of the central portion of the die attach pad has the IC die mounted on, and
a cap having a cavity and a planar rim surrounding the cavity, such that the cavity faces the IC die when the rim is attached to the die attach pad, thereby enclosing the IC die;
a plurality of leads having lead fingers for wire bonding arranged in at least one peripheral row surrounding the die attach pad; and
a molding material that substantially encapsulates the IC die and at least partially fills the cavity, Wherein the cap is coupled to a power potential.

24. The package of claim 1, further comprising:
a thermally and electrically conductive adhesive in the at least one receptacle.

25. The package of claim 1, wherein the at least one tab has a conical, frustum, or laterally elongated shape.

26. The package of claim 1, wherein a tab is positioned on a corner of the planar rim portion.

27. The package of claim 1, wherein the at least one corresponding receptacle has an opening, indentation, or edge cutout configuration.

28. The package of claim 1, wherein the at least one tab and the at least one corresponding receptacle are configured to facilitate coupling the cap to the die attach pad in a predetermined orientation.

29. The package of claim 1, further comprising:
at least one wire bond that couples at least one bond pad on the IC die to the encasing structure, whereby the encasing structure is coupled to an electrical potential.

30. The package of claim 29, wherein the at least one bond pad is a ground pad, whereby the encasing structure is coupled to a ground potential.

31. The package of claim 1, wherein the cap has an outer surface that opposes the cavity, wherein a first portion of the outer surface is covered by the molding material, and wherein a second portion of the outer surface of the cap is not covered by the molding material.

32. The package of claim 1, wherein the molding material further encapsulates an outer surface of the cap that opposes the cavity.

33. The package of claim 1, wherein the cap has an outer surface that opposes the cavity, wherein the cap further comprises:
at least one opening through the cap that is open at the outer surface and conneds to the cavity.

34. The package of claim 33, wherein the at least one opening through the cap is configured to facilitate flow of a molding material into the cavity.

35. The package of claim 33, wherein the at least one opening through the cap is configured to facilitate release of an air pressure inside of the encasing structure.

36. The package of claim 1, wherein a peripheral dimension of the cap substantially coincides with a peripheral dimension of the substantially planar area enclosed by the peripheral row of leads.

37. The package of claim 1, wherein a peripheral dimension of the cap is within a peripheral dimension of the substantially planar area enclosed by the peripheral row of leads.

38. The package of claim 1, wherein a peripheral dimension of the cap exceeds a peripheral dimension of the substantially planar area enclosed by the peripheral row of leads.

39. The package of claim 1, wherein the cap has an outer surface that opposes the cavity, further comprising:
a heat sink coupled to the outer surface of the cap.

40. The package of claim 1, wherein the cap has an outer surface that opposes the cavity, wherein the outer surface of the cap is configured to be coupled to a substrate including a printed circuit board (PCB) and a printed wire board (PWB).

41. The package of claim 40, further comprising a thermally and electrically conductive adhesive coupling the outer surface of the cap to the substrate.

42. The package of claim 1, wherein the second surface of the central portion of the die attach pad is exposed to be coupled to a substrate including a printed circuit board and a printed wire board.

43. The package of claim 42, further comprising a thermally and electrically conductive adhesive coupling the die attach pad to the substrate.

44. The package of claim 1, wherein the package further comprises:
a heat slug, having a first surface coupled to an exposed second surface of the central portion of the die attach pad, and a second surface configured to be coupled to a substrate including a printed circuit board and a printed wire board.

45. The package of claim 1, wherein the encasing structure and the molding material provide environmental protection to the IC die.

46. The package of claim 1, wherein the encasing structure and the molding material is constructed and arranged to provide damping against mechanical shock and vibrations.

47. The package of claim 1, wherein the cap and the die attach pad are made of similar material including metal, metallic alloy, ferromagnetic material, and metallized polymer.

48. The package of claim 1, wherein the cap and the the attach pad are made of dissimilar materials.

49. The package of claim 1, wherein the package is a no-lead package.

* * * * *

UNITED STATES PATENT AND TRADEMARK OFFICE
CERTIFICATE OF CORRECTION

| | | |
|---|---|---|
| PATENT NO. | : 8,183,680 B2 | Page 1 of 1 |
| APPLICATION NO. | : 11/480579 | |
| DATED | : May 22, 2012 | |
| INVENTOR(S) | : Sam Ziqun Zhao et al. | |

It is certified that error appears in the above-identified patent and that said Letters Patent is hereby corrected as shown below:

Column 15, Line 64, please replace "a. tie" with --a tie--.

Column 16, Line 55, please replace "die:" with --die;--.

Column 17, Line 56, please replace "Wherein" with --wherein--.

Column 18, Line 24, please replace "conneds" with --connects--.

Column 20, Line 1, please replace "and the the" with --and the--.

Signed and Sealed this
Twenty-fourth Day of July, 2012

David J. Kappos
*Director of the United States Patent and Trademark Office*